US010339866B2

(12) United States Patent
Noguchi et al.

(10) Patent No.: US 10,339,866 B2
(45) Date of Patent: Jul. 2, 2019

(54) DISPLAY DEVICE AND DRIVING METHOD THEREFOR

(71) Applicant: Sharp Kabushiki Kaisha, Sakai, Osaka (JP)

(72) Inventors: Noboru Noguchi, Sakai (JP); Masanori Ohara, Sakai (JP); Noritaka Kishi, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 49 days.

(21) Appl. No.: 15/326,080

(22) PCT Filed: Jul. 8, 2015

(86) PCT No.: PCT/JP2015/069597
§ 371 (c)(1),
(2) Date: Jan. 13, 2017

(87) PCT Pub. No.: WO2016/009909
PCT Pub. Date: Jan. 21, 2016

(65) Prior Publication Data
US 2017/0200415 A1    Jul. 13, 2017

(30) Foreign Application Priority Data

Jul. 15, 2014  (JP) ................. 2014-144812

(51) Int. Cl.
G09G 3/34      (2006.01)
H01L 27/12     (2006.01)
H01L 27/32     (2006.01)
H01L 51/50     (2006.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC .. G09G 3/3258; G09G 3/3266; G09G 3/3413; G09G 2310/08; G09G 2340/0407;
(Continued)

(56) References Cited

U.S. PATENT DOCUMENTS 9,661,219 B2 *   5/2017  Wakazono ......... H04N 5/23241
2005/0104817 A1  5/2005  Kwak
(Continued)

FOREIGN PATENT DOCUMENTS

JP     2004-198809 A    7/2004
JP     2005-148749 A    6/2005
(Continued)

OTHER PUBLICATIONS

Official Communication issued in International Patent Application No. PCT/JP2015/069597, dated Sep. 29, 2015.

*Primary Examiner* — Charles V Hicks
(74) *Attorney, Agent, or Firm* — Keating & Bennett, LLP

(57) ABSTRACT

When a display mode is a high-resolution mode, image display is performed by time division driving. When the display mode is a low-resolution mode, image display is performed by defining j pixel circuits arranged continuously in a direction in which scanning signal lines extend as one group, bringing only one organic EL element into a light-emitting state in each of the pixel circuits in a frame period, and bringing organic EL elements having respective light emission colors different from one another into a light-emitting state in the j pixel circuits included in each group in the frame period. Pixel circuits in a display unit are configured such that the intervals of organic EL elements which go into a light-emitting state in the frame period when in the low-resolution mode are equalized regarding a direction in which the scanning signal lines extend.

17 Claims, 40 Drawing Sheets

(51) Int. Cl.
  *G09G 3/3233*  (2016.01)
  *G09G 3/3258*  (2016.01)
  *G09G 3/3266*  (2016.01)

(52) U.S. Cl.
  CPC ....... *G09G 3/3413* (2013.01); *H01L 27/1225* (2013.01); *H01L 27/3276* (2013.01); *H01L 51/5012* (2013.01); *G09G 2300/0814* (2013.01); *G09G 2300/0842* (2013.01); *G09G 2300/0861* (2013.01); *G09G 2310/08* (2013.01); *G09G 2320/0242* (2013.01); *G09G 2340/0407* (2013.01); *H01L 27/3211* (2013.01); *H01L 27/3213* (2013.01)

(58) Field of Classification Search
  CPC ........ G09G 2320/0242; H01L 27/3276; H01L 27/1225; H01L 27/3211; H01L 51/5012
  See application file for complete search history.

(56) References Cited

U.S. PATENT DOCUMENTS

2005/0104875 A1* 5/2005 Kwak .................. G09G 3/3233
                                                           345/204
2012/0138922 A1   6/2012 Yamazaki et al.

FOREIGN PATENT DOCUMENTS

| JP | 2005-148750 A | 6/2005 |
| JP | 2009-230079 A | 10/2009 |
| JP | 2012-134475 A | 7/2012 |

* cited by examiner

DIRECTION IN WHICH
SCANNING SIGNAL LINES EXTEND
→

A1 A2 A3 B1 B2 B3 C1 C2 C3

DIRECTION IN WHICH
SCANNING SIGNAL
LINES EXTEND →

DIRECTION IN WHICH
SCANNING SIGNAL
LINES EXTEND →

DIRECTION IN WHICH
SCANNING SIGNAL
LINES EXTEND →

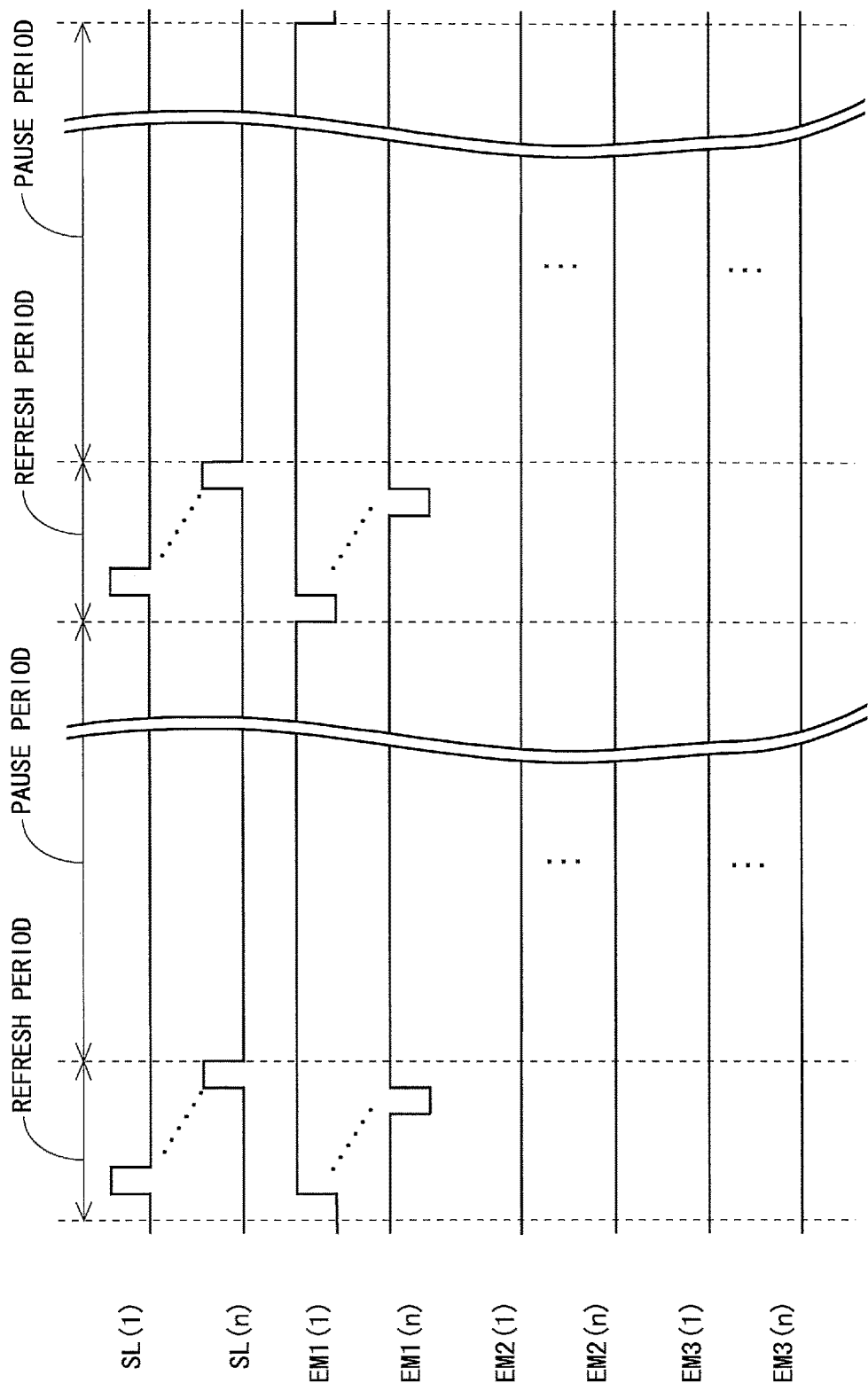

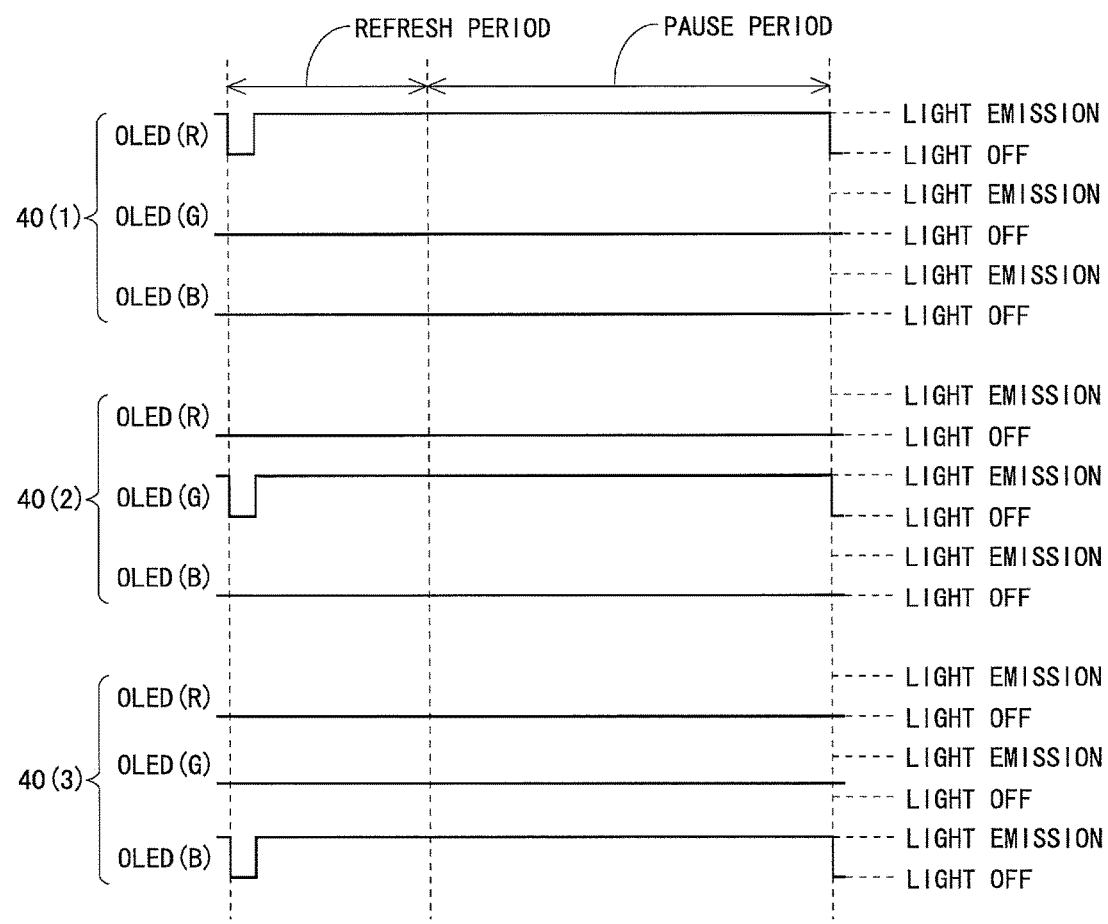

Fig.45

| | REFRESH PERIOD<br>FOR EXAMPLE, 16.6ms | PAUSE PERIOD<br>FOR EXAMPLE, 1s |
|---|---|---|
| PIXEL CIRCUIT 40(1) | R LIGHT EMISSION | R LIGHT EMISSION |
| PIXEL CIRCUIT 40(2) | G LIGHT EMISSION | G LIGHT EMISSION |
| PIXEL CIRCUIT 40(3) | B LIGHT EMISSION | B LIGHT EMISSION |
| ELVDD | ON | ON |
| ELVSS | ON | ON |
| SOURCE DRIVER | ON | OFF |
| GATE DRIVER (SCANNING OPERATION) | ON | OFF |
| EMISSION DRIVER (SCANNING OPERATION) | ON | OFF |
| EM1 | SELECTED STATE | SELECTED STATE |
| EM2 | NON-SELECTED STATE | NON-SELECTED STATE |
| EM3 | NON-SELECTED STATE | NON-SELECTED STATE |

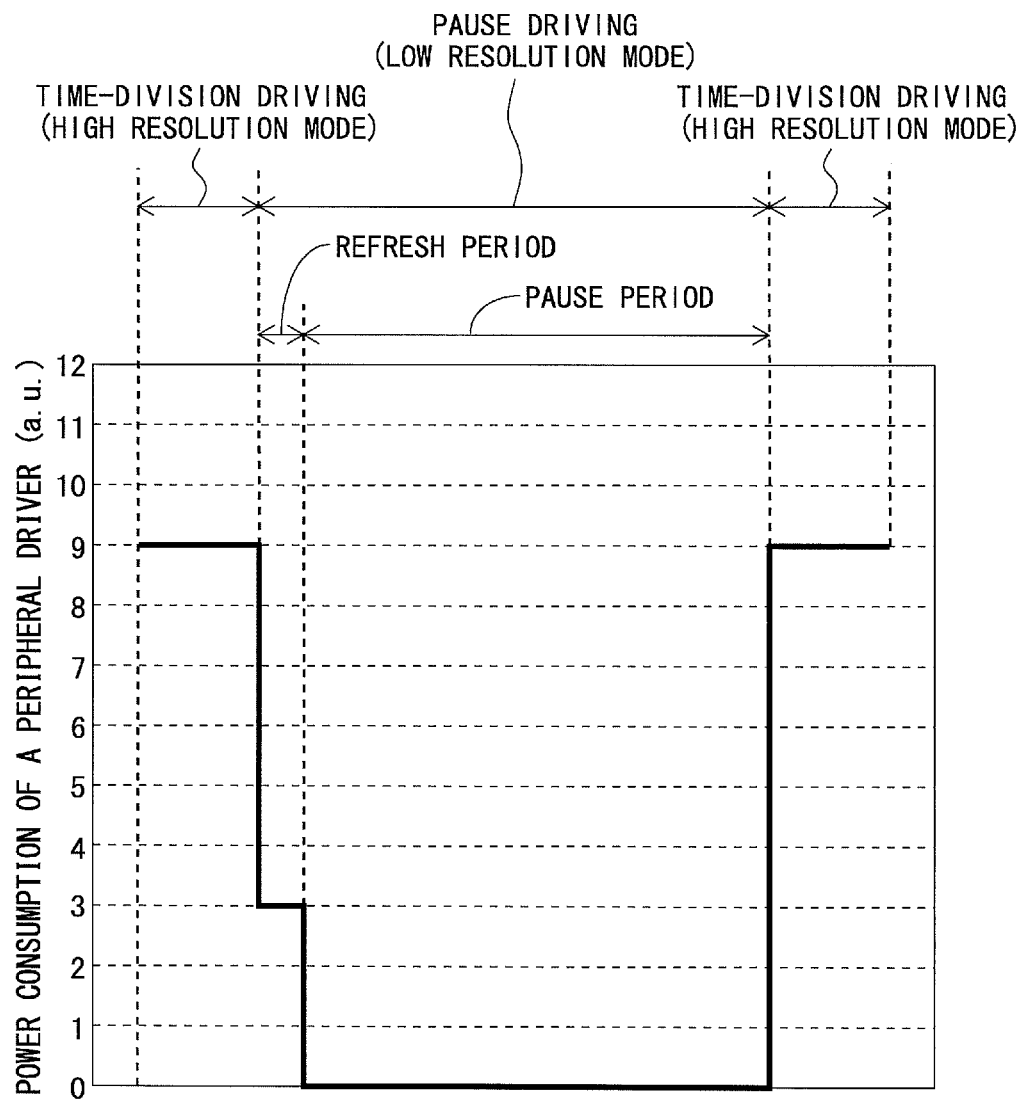

Fig.47

| DRIVERS | TIME-DIVISION DRIVING | | PAUSE DRIVING (PAUSE PERIOD) | |
|---|---|---|---|---|
| | DRIVING FREQUENCY (Hz) | POWER CONSUMPTION (W) | DRIVING FREQUENCY (Hz) | POWER CONSUMPTION (W) |
| GATE DRIVER | $3 \times f1$ | $3 \times C1(V1)^2 f1$ | 0 | 0 |
| FIRST EMISSION DRIVER | $3 \times f2$ | $3 \times C2(V2)^2 f2$ | 0 | ONLY DIRECT-CURRENT COMPONENT |
| SECOND EMISSION DRIVER | $3 \times f3$ | $3 \times C3(V3)^2 f3$ | 0 | 0 |
| THIRD EMISSION DRIVER | $3 \times f4$ | $3 \times C4(V4)^2 f4$ | 0 | 0 |
| SOURCE DRIVER | $3 \times f5$ | $3 \times C5(V5)^2 f5$ | 0 | 0 |

Fig.53

| | FIRST SUBFRAME | | | SECOND SUBFRAME | | | THIRD SUBFRAME |
|---|---|---|---|---|---|---|---|
| | FLYBACK PERIOD | LIGHT EMISSION PERIOD | FLYBACK PERIOD | LIGHT EMISSION PERIOD | FLYBACK PERIOD | LIGHT EMISSION PERIOD | |
| LIGHTING STATE | ALL LIGHT OFF | R LIGHT EMISSION | ALL LIGHT OFF | G LIGHT EMISSION | ALL LIGHT OFF | B LIGHT EMISSION | |
| DRIVE CURRENT | OFF | ON | OFF | ON | OFF | ON | |
| ELVDD | ON | ON | ON | ON | ON | ON | |
| ELVSS | ON | ON | ON | ON | ON | ON | |
| SOURCE DRIVER | OFF | ON | OFF | ON | OFF | ON | |
| GATE DRIVER (SCANNING OPERATION) | OFF | ON | OFF | ON | OFF | ON | |
| EMISSION DRIVER (SCANNING OPERATION) | OFF | ON | OFF | ON | OFF | ON | |
| EM1 | NON-SELECTED STATE | SELECTED STATE | NON-SELECTED STATE | NON-SELECTED STATE | NON-SELECTED STATE | NON-SELECTED STATE | |
| EM2 | NON-SELECTED STATE | NON-SELECTED STATE | NON-SELECTED STATE | SELECTED STATE | NON-SELECTED STATE | NON-SELECTED STATE | |
| EM3 | NON-SELECTED STATE | NON-SELECTED STATE | NON-SELECTED STATE | NON-SELECTED STATE | NON-SELECTED STATE | SELECTED STATE | |

ONE FRAME PERIOD

Fig.54

| DRIVERS | GENERAL DRIVING | | | | TIME-DIVISION DRIVING | |
|---|---|---|---|---|---|---|
| | FREQUENCY (Hz) | VOLTAGE AMPLITUDE (V) | PARASITIC CAPACITANCE (F) | POWER (W) | FREQUENCY (Hz) | POWER (W) |
| GATE DRIVER | f1 | V1 | C1 | $C1(V1)^2 f1$ | $3 \times f1$ | $3 \times C1(V1)^2 f1$ |
| FIRST EMISSION DRIVER | f2 | V2 | C2 | $C2(V2)^2 f2$ | $3 \times f2$ | $3 \times C2(V2)^2 f2$ |
| SECOND EMISSION DRIVER | f3 | V3 | C3 | $C3(V3)^2 f3$ | $3 \times f3$ | $3 \times C3(V3)^2 f3$ |
| THIRD EMISSION DRIVER | f4 | V4 | C4 | $C4(V4)^2 f4$ | $3 \times f4$ | $3 \times C4(V4)^2 f4$ |
| SOURCE DRIVER | f5 | V5 | C5 | $C5(V5)^2 f5$ | $3 \times f5$ | $3 \times C5(V5)^2 f5$ |

DISPLAY DEVICE AND DRIVING METHOD THEREFOR

TECHNICAL FIELD

The present invention relates to a display device and more particularly to a display device including self light-emitting type display elements which are driven by a current, such as an organic EL display device, and a method for driving the display device.

BACKGROUND ART

Conventionally, as display elements included in a display device, there are an electro-optical element whose luminance is controlled by a voltage applied thereto, and an electro-optical element whose luminance is controlled by a current flowing therethrough. A representative example of the electro-optical element whose luminance is controlled by a voltage applied thereto includes a liquid crystal display element. On the other hand, a representative example of the electro-optical element whose luminance is controlled by a current flowing therethrough includes an organic EL (Electro Luminescence) element. The organic EL element is also called an OLED (Organic Light-Emitting Diode). An organic EL display device using organic EL elements, which are self light-emitting type electro-optical elements, can easily achieve slimming down, a reduction in power consumption, an increase in luminance, etc., compared to a liquid crystal display device, which requires a backlight, color filters and so on. Therefore, in recent years, there has been active development of organic EL display devices.

As the driving system of an organic EL display device, there are known a passive matrix system (also called a simple matrix system) and an active matrix system. An organic EL display device adopting the passive matrix system is simple in structure, but is difficult to achieve size increase and definition improvement. On the other hand, an organic EL display device adopting the active matrix system (hereinafter, referred to as "active matrix-type organic EL display device") can easily achieve size increase and definition improvement, compared to the organic EL display device adopting the passive matrix system.

The active matrix-type organic EL display device has pixel circuits formed in a matrix form. Each pixel circuit of the active matrix-type organic EL display device typically includes an input transistor that selects a pixel, and a drive transistor that controls the supply of a current to an organic EL element. Note that in the following the current flowing through the organic EL element from the drive transistor may be referred to as "drive current".

Meanwhile, in a general active matrix-type organic EL display device, one pixel includes three subpixels (an R subpixel that displays red, a G subpixel that displays green, and a B subpixel that displays blue). FIG. 48 is a circuit diagram showing a configuration of a conventional general pixel circuit 91 forming one subpixel. The pixel circuit 91 is provided corresponding to each of intersections of data lines DL and scanning signal lines SL, which are disposed in a display unit. As shown in FIG. 48, the pixel circuit 91 includes two transistors T1 and T2, one capacitor Cst, and one organic EL element OLED. The transistor T1 is a drive transistor and the transistor T2 is an input transistor. Note that in the example shown in FIG. 48, the transistors T1 and T2 are n-channel thin-film transistors (TFTs).

The transistor T1 is provided in series with the organic EL element OLED. The transistor T1 is connected at its gate terminal to a drain terminal of the transistor T2, connected at its drain terminal to a power supply line that supplies a high-level power supply voltage ELVDD (hereinafter, referred to as "high-level power supply line" and denoted by the same reference character ELVDD as the high-level power supply voltage), and connected at its source terminal to an anode terminal of the organic EL element OLED. The transistor T2 is provided between the data line DL and the gate terminal of the transistor T1. The transistor T2 is connected at its gate terminal to the scanning signal line SL, connected at its drain terminal to the gate terminal of the transistor T1, and connected at its source terminal to the data line DL. The capacitor Cst is connected at its one end to the gate terminal of the transistor T1 and connected at its other end to the source terminal of the transistor T1. A cathode terminal of the organic EL element OLED is connected to a power supply line that supplies a low-level power supply voltage ELVSS (hereinafter, referred to as "low-level power supply line" and denoted by the same reference character ELVSS as the low-level power supply voltage). A connecting point among the gate terminal of the transistor T1, the one end of the capacitor Cst, and the drain terminal of the transistor T2 is hereinafter referred to as "gate node" for convenience sake. A gate-node potential is denoted by reference character VG. Note that although in general, one of the drain and source that has a higher potential is called a drain, in the description of this specification, one is defined as a drain and the other is defined as a source, and thus, a source potential may be higher than a drain potential in some cases.

FIG. 49 is a timing chart for describing the operation of the pixel circuit 91 shown in FIG. 48. Prior to time t91, the scanning signal line SL is in a non-selected state. Therefore, prior to time t91, the transistor T2 is in an off state, and the gate node potential VG keeps its initial level (e.g., a level determined depending on writing performed in the preceding frame). When time t91 comes, the scanning signal line SL goes into a selected state and thus the transistor T2 is turned on. By this, a data voltage Vdata corresponding to the luminance of a pixel (subpixel) formed by the pixel circuit 91 is supplied to the gate node through the data line DL and the transistor T2. Thereafter, during a period until time t92, the gate node potential VG changes depending on the data voltage Vdata. At this time, the capacitor Cst is charged to a gate-source voltage Vgs, which is the difference between the gate node potential VG and the source potential of the transistor T1. When time t92 comes, the scanning signal line SL goes into a non-selected state. By this, the transistor T2 is turned off, and the gate-source voltage Vgs held in the capacitor Cst is fixed. The transistor T1 supplies a drive current to the organic EL element OLED, depending on the gate-source voltage Vgs held in the capacitor Cst. As a result, the organic EL element OLED emits light at a luminance depending on the drive current.

Meanwhile, the pixel circuit 91 shown in FIG. 48 is a circuit corresponding to one subpixel. Therefore, a configuration of a pixel circuit 910 corresponding to one pixel including three subpixels is as shown in FIG. 50. As shown in FIG. 50, the pixel circuit 910 forming one pixel includes a pixel circuit 91(R) for an R subpixel, a pixel circuit 91(G) for a G subpixel, and a pixel circuit 91(B) for a B subpixel. According to the configuration shown in FIG. 50, since many circuit elements are required within a pixel circuit, it is difficult to achieve definition improvement.

In view of this, Japanese Patent Application Laid-Open No. 2005-148749 discloses, as shown in FIG. 51, a pixel circuit 920 configured to further reduce the numbers of transistors and capacitors that are required for one pixel over the conventional one. The pixel circuit 920 includes a driving means 921, a sequential control means 922, and three organic EL elements OLED(R), OLED(G), and OLED (B). The driving means 921 includes a drive transistor T11, an input transistor T12, and a capacitor Cst1. The sequential control means 922 includes a transistor T13(R) for controlling the light emission of the red-color organic EL element OLED(R), a transistor T13(G) for controlling the light emission of the green-color organic EL element OLED(G), and a transistor T13(B) for controlling the light emission of the blue-color organic EL element OLED(B). In addition, as wiring lines for controlling the on/off of the transistors T13(R), T13(G), and T13(B), emission lines EM1, EM2, and EM3 are provided so as to pass through the pixel circuit 920.

In the above-described configuration, one frame period is divided into three sub-frames. Specifically, one frame period is divided into a first sub-frame for performing red light emission, a second sub-frame for performing green light emission, and a third sub-frame for performing blue light emission. Then, in the sequential control means 922, only the transistor T13(R) is brought into an on state in the first sub-frame, only the transistor T13(G) is brought into an on state in the second sub-frame, and only the transistor T13(B) is brought into an on state in the third sub-frame. By this, the organic EL element OLED(R), the organic EL element OLED(G), and the organic EL element OLED(B) sequentially emit light over one frame period, displaying a desired color image. As such, the organic EL display device disclosed in Japanese Patent Application Laid-Open No. 2005-148749 performs so-called "time-division driving".

Note that Japanese Patent Application Laid-Open No. 2005-148750 discloses an invention of an organic EL display device that performs the time-division driving using a pixel circuit 930 having a configuration shown in FIG. 52.

PRIOR ART DOCUMENTS

Patent Documents

[Patent Document 1] Japanese Patent Application Laid-Open No. 2005-148749
[Patent Document 2] Japanese Patent Application Laid-Open No. 2005-148750

SUMMARY OF THE INVENTION

Problems to be Solved by the Invention

However, when an organic EL display device adopts the time-division driving such as that described above, power consumption increases compared to the case of adopting a conventional general driving method which is not the time-division driving (here, the general driving method is referred to as "general driving"). This will be described below with reference to FIGS. 53 and 54.

In the time-division driving, a light-emitting period and a flyback period are alternately repeated. The light-emitting period is a period for performing light emission of any one of three colors. In the light-emitting period, in order to allow organic EL elements to emit light at desired luminance, the operation of a source driver (a circuit that drives data lines), a gate driver (a circuit that drives scanning signal lines), and an emission driver (a circuit that drives emission lines) goes into an on state (see FIG. 53). Although the length of the light-emitting period is fairly longer than the length of the flyback period, in each light-emitting period, organic EL elements ranging from those included in the first row to those included in the last row need to sequentially emit light in a period with a length that is substantially one-third of one frame period of the general driving. Hence, in the case of adopting the time-division driving, the driving frequency (driving speed) is about three times higher compared to the case of adopting the general driving. When the parasitic capacitance is C, the voltage amplitude is V, and the driving frequency is f, the power consumption P of a peripheral driver is represented by the following equation (1):

[Expression 1]

$$P = C \times V^2 \times f \qquad (1)$$

It can be grasped from the above equation (1) that the power consumption P of the peripheral driver is proportional to the driving frequency f. Therefore, as shown in FIG. 54, the power consumption of each peripheral driver in the case of adopting the time-division driving is three times higher than that of the case of adopting the general driving. Regarding this, for example, even when a still image such as a standby screen of a mobile phone is displayed, since the peripheral drivers need to be operated at high frequencies, power consumption increases. Note that the peripheral drivers in this specification refer to drive circuits which are provided in a peripheral region of the display unit to allow the pixel circuits to operate. In addition, as for FIG. 54, first to third emission drivers are circuits for respectively driving the emission lines EM1 to EM3 in FIG. 51.

Further, in the case of adopting the time-division driving, the length of the light-emitting period of each organic EL element is one-third as long as that of the case of adopting the general driving. Therefore, in order to obtain a luminance of a panel equivalent to that of the case of adopting the general driving, it is necessary to triple a light emission luminance of each organic EL element. Accordingly, a momentary luminance of each organic EL element is increased. Since lifetime of the organic EL element is considered to be inversely proportional to a momentary luminance to the power of 1.8 to 2, lifetime of the organic EL element is short in an organic EL display device adopting the time-division driving.

Meanwhile, to lower the resolution by lowering the driving frequency when an image not required to display with high-resolution is considered as a method of reducing the power consumption. However, in a case where the resolution of a display image is lowered in an organic EL display device including pixel circuits configured on the assumption that the time-division driving is performed, it is apprehended that display unevenness (color unevenness) or vertical stripes occur due to an arrangement of pixels (an alignment sequence of subpixels).

An object of the present invention is therefore to reduce power consumption over the conventional one while suppressing shortening of the lifetime of elements without causing a display defect in a display device that has self light-emitting type display elements which are driven by a current and that adopts the time-division driving.

Means for Solving the Problems

A first aspect of the present invention is directed to a display device including a display unit that includes: pixel circuits arranged in a matrix form so as to form rows and columns; scanning signal lines provided in a one-to-one correspondence with the rows; and data lines provided in a one-to-one correspondence with the columns, wherein the pixel circuits are configured such that intervals of electro-optical elements which go into a light-emitting state in each unit frame when display in low resolution mode, in which a relatively low resolution image is displayed on the display unit, is performed are equalized regarding a direction in which the scanning signal lines extend.

According to a second aspect of the present invention, in the first aspect of the present invention, each of the pixel circuits includes j electro-optical elements (j is an integer greater than or equal to two) each having an individual light-emitting color, display mode is switchable between the low resolution mode and high resolution mode, in which a relatively high resolution image is displayed on the display unit, when the display mode is the high resolution mode, image display on the display unit is performed by dividing a unit frame into j sub-frames and bringing an electro-optical element having a different light-emitting color into a light-emitting state on a sub-frame-by-sub-frame basis in each of the pixel circuits, the unit frame being a period in which image display for one screen is performed, and when the display mode is the low resolution mode, image display on the display unit is performed by defining j pixel circuits which are arranged continuously in a direction in which the scanning signal lines extend as one group, bringing one of the j electro-optical elements into a light-emitting state in each of the pixel circuits in a unit frame, and bringing electro-optical elements having respective light-emitting colors different from one another into a light-emitting state in j pixel circuits included in each group in the unit frame.

According to a third aspect of the present invention, in the second aspect of the present invention, when the display mode is the low resolution mode, still image display on the display unit is performed at a refresh rate lower than that for when the display mode is the high resolution mode, by repeating a refresh period during which writing of image data to the pixel circuits is performed and a pause period during which the writing of image data to the pixel circuits is brought into a pause state, and driving of the scanning signal lines and the data lines is stopped in the pause period.

According to a fourth aspect of the present invention, in the second aspect of the present invention, each of the pixel circuits further includes:
j light-emission control transistors provided in a one-to-one correspondence with the j electro-optical elements; and
a drive current control unit configured to control a drive current for bringing the j electro-optical elements into a light-emitting state,
the display unit includes j light-emission control lines for each row,
in each of the pixel circuits,
control terminals of the j light-emission control transistors are connected to different light-emission control lines,
first conduction terminals of the j light-emission control transistors are connected to the drive current control unit, and
second conduction terminals of the light-emission control transistors are connected to respective electro-optical elements,
when focusing on j pixel circuits included in each group and j light-emission control lines corresponding to the j pixel circuits, each of the focused j light-emission control lines is connected to control terminals of light-emission control transistors corresponding to electro-optical elements having respective light-emitting colors different from one another in the focused j pixel circuits, when the display mode is the high resolution mode, the j light-emission control lines are sequentially brought into a selected state on a sub-frame-by-sub-frame basis for each row, and when the display mode is the low resolution mode, only one of the j light-emission control lines is brought into a selected state for each row in a unit frame.

According to a fifth aspect of the present invention, in the fourth aspect of the present invention, when focusing on j light-emission control lines corresponding to each row, a light-emission control line brought into a selected state when the display mode is the low resolution mode is changed appropriately.

According to a sixth aspect of the present invention, in the fifth aspect of the present invention, a light-emission control line brought into a selected state when the display mode is the low resolution mode is changed every time the display mode is switched from the high resolution mode to the low resolution mode.

According to a seventh aspect of the present invention, in the fourth aspect of the present invention, the display device further includes:

a first power supply line disposed in the display unit and configured to supply a high-level constant voltage to the pixel circuits;

a second power supply line disposed in the display unit and configured to supply a low-level constant voltage to the pixel circuits;

a scanning signal line drive circuit configured to drive the scanning signal lines;

a data line drive circuit configured to drive the data lines; and a light-emission control line drive circuit configured to drive the light-emission control lines, wherein
the drive current control unit includes:
a drive transistor provided between the first power supply line and the second power supply line so as to be in series with each of the j light-emission control transistors, and configured to control the drive current;
an input transistor provided between a corresponding data line and a control terminal of the drive transistor, and configured to electrically connect the corresponding data line to the control terminal of the drive transistor when a corresponding scanning signal line is brought into a selected state by the scanning signal line drive circuit; and
a capacitor provided between the control terminal of the drive transistor and one conduction terminal of the drive transistor, when the display mode is the low resolution mode, still image display on the display unit is performed at a refresh rate lower than that for when the display mode is the high resolution mode, by repeating a refresh period during which writing of image data to the pixel circuits is performed and a pause period during which the writing of image data to the pixel circuits is brought into a pause state, in the refresh period,
the light-emission control line drive circuit brings, for each row, only one of the j light-emission control lines into a selected state,
the scanning signal line drive circuit sequentially brings the scanning signal lines into a selected state, and
the data line drive circuit applies data voltages depending on a still image to be displayed on the display unit when the display mode is the low resolution mode, to the data lines, in response to each of the scanning signal lines going into a selected state, and in the pause period, the light-emission control line drive circuit keeps the light-emission control line brought into the selected state in the refresh period in the selected state and keeps other light-emission control lines in a non-selected state, and the scanning signal line drive circuit and the data line drive circuit go into a pause state.

According to an eighth aspect of the present invention, in the seventh aspect of the present invention, the light-emission control line drive circuit brings, in a period immediately before writing of image data to the pixel circuits forming each row is performed, all of the j light-emission control lines corresponding to each row into a non-selected state, in the refresh period.

According to a ninth aspect of the present invention, in the seventh aspect of the present invention, the drive transistor, the input transistor, and the j light-emission control transistors are thin-film transistors whose channel layers are formed of an oxide semiconductor.

According to a tenth aspect of the present invention, in the ninth aspect of the present invention, main components of the oxide semiconductor are indium (In), gallium (Ga), zinc (Zn), and oxygen (O).

According to an eleventh aspect of the present invention, in the second aspect of the present invention, when the display mode is the low resolution mode, one pixel is formed by j pixel circuits included in one group, and an image with a resolution equal to 1/j of a resolution of an image displayed on the display unit when the display mode is the high resolution mode is displayed on the display unit.

According to a twelfth aspect of the present invention, in the second aspect of the present invention, when the display mode is the low resolution mode, one pixel is formed by k×j pixel circuits included in k groups corresponding to k consecutive rows (k is an integer greater than or equal to two), and an image with a resolution equal to 1/(k×j) of a resolution of an image displayed on the display unit when the display mode is the high resolution mode is displayed on the display unit.

According to a thirteenth aspect of the present invention, in the twelfth aspect of the present invention, a value of the k is determined such that a shape of each pixel for when the display mode is the low resolution mode is a square.

According to a fourteenth aspect of the present invention, in the second aspect of the present invention, the j electro-optical elements included in each of the pixel circuits are three organic electroluminescence elements having a red light-emitting color, a green light-emitting color, and a blue light-emitting color.

According to a fifteenth aspect of the present invention, in the second aspect of the present invention, the j electro-optical elements included in each of the pixel circuits are four organic electroluminescence elements having a red light-emitting color, a green light-emitting color, a blue light-emitting color, and a white light-emitting color.

According to a sixteenth aspect of the present invention, in the second aspect of the present invention, when focusing on a p-th electro-optical element (p is an integer between 1 and j, inclusive) regarding a direction in which the scanning signal lines extend in each of the j pixel circuits included in each group, j electro-optical elements focused in each group are electro-optical elements having respective light-emitting colors different from one another.

According to a seventeenth aspect of the present invention, in the first aspect of the present invention, each of the pixel circuits includes j electro-optical elements (j is an integer greater than or equal to two) each having an individual light-emitting color, an alignment sequence of light-emitting colors regarding the j electro-optical elements in an arbitrary pixel circuit is different from that in a pixel circuit arranged, in a direction in which the scanning signal lines extend, next to the arbitrary pixel circuit, and an alignment sequence of light-emitting colors regarding the j electro-optical elements in an arbitrary pixel circuit is same as that in a pixel circuit arranged, in a direction in which the scanning signal lines extend, j pixel circuits away from the arbitrary pixel circuit.

An eighteenth aspect of the present invention is directed to a driving method for a display device including a display unit that includes: pixel circuits arranged in a matrix form so as to form rows and columns; scanning signal lines provided in a one-to-one correspondence with the rows; and data lines provided in a one-to-one correspondence with the columns, each of the pixel circuits including j electro-optical elements (j is an integer greater than or equal to two) each having an individual light-emitting color, the method comprising:

a high resolution display step of displaying a relatively high resolution image on the display unit, and a low resolution display step of displaying a relatively low resolution image on the display unit, wherein in the high resolution display step, image display on the display unit is performed by dividing a unit frame into j sub-frames and bringing an electro-optical element having a different light-emitting color into a light-emitting state on a sub-frame-by-sub-frame basis in each of the pixel circuits, the unit frame being a period in which image display for one screen is performed, in the low resolution display step, image display on the display unit is performed by defining j pixel circuits which are arranged continuously in a direction in which the scanning signal lines extend as one group, bringing one of the j electro-optical elements into a light-emitting state in each of the pixel circuits in a unit frame, and bringing electro-optical elements having respective light-emitting colors different from one another into a light-emitting state in j pixel circuits included in each group in the unit frame, and the pixel circuits are configured such that intervals of electro-optical elements which go into a light-emitting state in each unit frame when image display on the display unit is performed in the low resolution display step are equalized regarding a direction in which the scanning signal lines extend.

Effects of the Invention

According to the first aspect of the present invention, intervals of electro-optical elements which go into a light-emitting state in each unit frame when in the low resolution mode is equalized regarding a direction in which the scanning signal lines extend. Accordingly, occurrence of display unevenness (color unevenness) or vertical stripes is suppressed, and an image with which viewers do not feel uncomfortable is displayed.

According to the second aspect of the present invention, when a low resolution image is displayed, j pixel circuits are defined as one group, and electro-optical elements having respective light-emitting colors different from one another are brought into a light-emitting state in j pixel circuits included in each group. Hence, a color image with a resolution not more than 1/j of a resolution in the time-division driving can be displayed by one vertical scanning. In this way, in a display device that adopts the time-division driving, it is possible to display a low resolution image while lowering the driving frequency. Accordingly, by switching, depending on the magnitude of demand regarding a definition of a display image, for example, the display mode between a high resolution mode, in which a high resolution image is displayed by the time-division driving, and a low resolution mode, in which a low resolution image is displayed by a driving method whose driving frequency is lower than that of the time-division driving, power consumption can be reduced compared to that in a case where image display is always performed by the time-division driving. Moreover, when in the low resolution mode, momentary luminances of the electro-optical elements do not need to be increased compared to those in a case where the time-division driving is performed. Thus, shortening of the lifetime of the electro-optical elements is suppressed. As described above, in a display device that adopts the time-division driving, it is possible to reduce power consumption over the conventional one while suppressing shortening of the lifetime of elements without causing a display defect.

According to the third aspect of the present invention, when the display mode is the low resolution mode, pause driving is performed where a refresh period during which writing of image data is performed and a pause period during which the writing of image data is stopped are repeated. Accordingly, power consumption of peripheral drivers (drive circuits which are provided in a peripheral region of the display unit to allow the pixel circuits to operate) can be greatly reduced compared to that in a case where image display is always performed by the time-division driving. In this manner, in regard to reducing power consumption, an extremely remarkable effect is obtained.

According to the fourth aspect of the present invention, electro-optical elements having respective light-emitting colors different form one another can be brought into a light-emitting state in j pixel circuits included in each group by selecting one of j light-emission control lines corresponding to each row. Hence, power consumption resulting from driving of the light-emission control lines when in the low resolution mode becomes very small.

According to the fifth aspect of the present invention, the occurrence of bias in the levels of degradation of transistors and degradation of electro-optical elements in each pixel circuit is prevented.

According to the sixth aspect of the present invention, as with the fifth aspect of the present invention, the occurrence of bias in the levels of degradation of transistors and degradation of electro-optical elements in each pixel circuit is prevented.

According to the seventh aspect of the present invention, in a display device in which a drive current control unit controlling a drive current for bringing the electro-optical elements into a light-emitting state includes a drive transistor, an input transistor, and a capacitor, the scanning signal line drive circuit and the data line drive circuit go into a pause state and the light-emission control line drive circuit consumes only direct-current power during a pause period. By this, regarding the display device that performs the time-division driving, power consumption can be certainly further reduced over the conventional one.

According to the eighth aspect of the present invention, in each pixel circuit, an electro-optical element included in the pixel circuit is temporarily brought into a light-off state when writing of image data is performed. Hence, display in each frame period is suppressed from being affected by display in the preceding frame period. Accordingly, the display quality of an image displayed when in the low resolution mode is increased.

According to the ninth aspect of the present invention, the off-leakage current in the transistors in the pixel circuits becomes very small. Hence, voltages depending on a display image can be held in the capacitors in the pixel circuits for a longer period of time than the conventional one. Accordingly, by increasing the length of a pause period to reduce the refresh rate, power consumption can be significantly reduced over the conventional one.

According to the tenth aspect of the present invention, by using indium gallium zinc oxide as an oxide semiconductor which forms a channel layer, the effect of the ninth aspect of the present invention can be certainly attained.

According to the eleventh aspect of the present invention, while a reduction in resolution for when the display mode is switched from the high resolution mode to the low resolution mode is minimized, the same effect as that of the first aspect of the present invention can be obtained.

According to the twelfth aspect of the present invention, when the display mode is the low resolution mode, the same image data may be written on k consecutive rows for each column. Hence, power consumption resulting from writing of image data when in the low resolution mode is reduced.

According to the thirteenth aspect of the present invention, a more natural image is displayed on the display unit when the display mode is the low resolution mode.

According to the fourteenth aspect of the present invention, in a display device using, as the electro-optical elements, three organic electroluminescence elements having a red light-emitting color, a green light-emitting color, and a blue light-emitting color, the same effect as that of the first aspect of the present invention can be obtained.

According to the fifteenth aspect of the present invention, in a display device using, as the electro-optical elements, four organic electroluminescence elements having a red light-emitting color, a green light-emitting color, a blue light-emitting color, and a white light-emitting color, the same effect as that of the first aspect of the present invention can be obtained.

According to the sixteenth aspect of the present invention, occurrence of display unevenness (color unevenness) or vertical stripes is certainly suppressed.

According to the seventeenth aspect of the present invention, occurrence of display unevenness (color unevenness) or vertical stripes when in the low resolution mode is suppressed while making the time-division driving possible.

According to the eighteenth aspect of the present invention, in a driving method for a display device, the same effect as that of the first aspect of the present invention can be obtained.

BRIEF DESCRIPTION OF THE DRAWINGS

FIG. 20 is a schematic diagram showing light-emitting states for a first sub-frame in the first embodiment.

FIG. 21 is a schematic diagram showing light-emitting states for a second sub-frame in the first embodiment.

FIG. 22 is a schematic diagram showing light-emitting states for a third sub-frame in the first embodiment.

FIG. 43 is a timing chart showing the waveforms of scanning signals and light-emission control signals for when the display mode is a low resolution mode in the second embodiment.

FIG. 44 is a diagram showing the transitions of the light-emitting states of organic EL elements in three pixel circuits included in one group in the second embodiment.

FIG. 45 is a diagram for describing an effect in the second embodiment.

FIG. 46 is a diagram for describing an effect in the second embodiment.

FIG. 47 is a diagram for describing an effect in the second embodiment.

FIG. 53 is a diagram for describing the time-division driving in a conventional organic EL display device.

FIG. 54 is a diagram for describing differences in the power consumption of peripheral drivers between when general driving is adopted and when the time-division driving is adopted in a conventional example.

MODE FOR CARRYING OUT THE INVENTION

An embodiment of the present invention will be described below with reference to the accompanying drawings. Note that in the following it is assumed that m and n are integers greater than or equal to 2. Note also that, as for each transistor, the gate terminal corresponds to a control terminal, the drain terminal corresponds to a first conduction terminal, and the source terminal corresponds to a second conduction terminal.

1. First Embodiment

<1.1 Overall Configuration and Summary of Operation>

Figure 2:
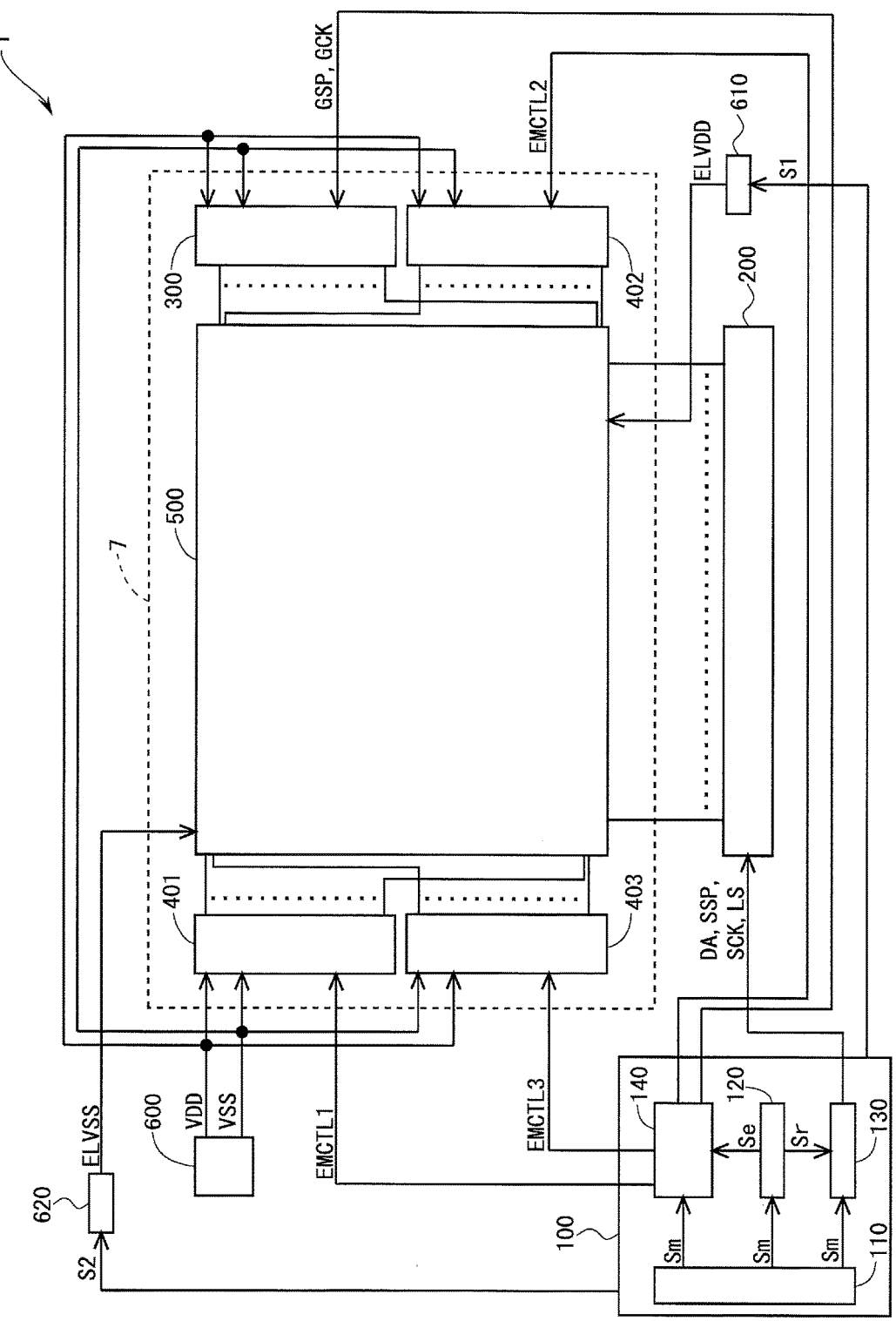
FIG. 2 is a block diagram showing an overall configuration of the organic EL display device in the first embodiment.

FIG. 2 is a block diagram showing an overall configuration of an active matrix-type organic EL display device 1 according to a first embodiment of the present invention. The organic EL display device 1 includes a display control circuit 100, a source driver (a data line drive circuit) 200, a gate driver (a scanning signal line drive circuit) 300, first to third emission drivers (first to third light-emission control line drive circuits) 401 to 403, and a display unit 500. The first to third emission drivers 401 to 403 are hereinafter also collectively and simply referred to as "emission driver". The emission driver is a drive circuit for wiring lines (emission lines which will be described later) for controlling the light emission of organic EL elements provided in the display unit 500. Note that in the present embodiment the gate driver 300 and the first to third emission drivers 401 to 403 are formed in an organic EL panel 7 including the display unit 500. That is, the gate driver 300 and the emission driver are monolithic. In addition, the organic EL display device 1 is provided with a logic power supply 600, an organic EL high-level power supply 610, and an organic EL low-level power supply 620, as components for supplying various types of power supply voltages to the organic EL panel 7.

Meanwhile, in the organic EL display device 1 according to the present embodiment, a high resolution mode for displaying a relatively high resolution image on the display unit 500 and a low resolution mode for displaying a relatively low resolution image on the display unit 500 are prepared for display modes. When the display mode is the high resolution mode, a time-division driving that divides one frame period (a unit frame that is a period in which image display for one screen is performed) into j sub-frames (j is an integer greater than or equal to two) is performed. In the present embodiment, since subpixels of three colors (an R subpixel that displays red, a G subpixel that displays green, and a B subpixel that displays blue) are provided as described below, a time-division driving that divides one frame period into three sub-frames is performed.

A high-level power supply voltage VDD and a low-level power supply voltage VSS which are required for the operation of the gate driver 300 and the first to third emission drivers 401 to 403 are supplied to the organic EL panel 7 from the logic power supply 600. A high-level power supply voltage ELVDD, which is a constant voltage, is supplied to the organic EL panel 7 from the organic EL high-level power supply 610. A low-level power supply voltage ELVSS, which is a constant voltage, is supplied to the organic EL panel 7 from the organic EL low-level power supply 620.

Figure 3:
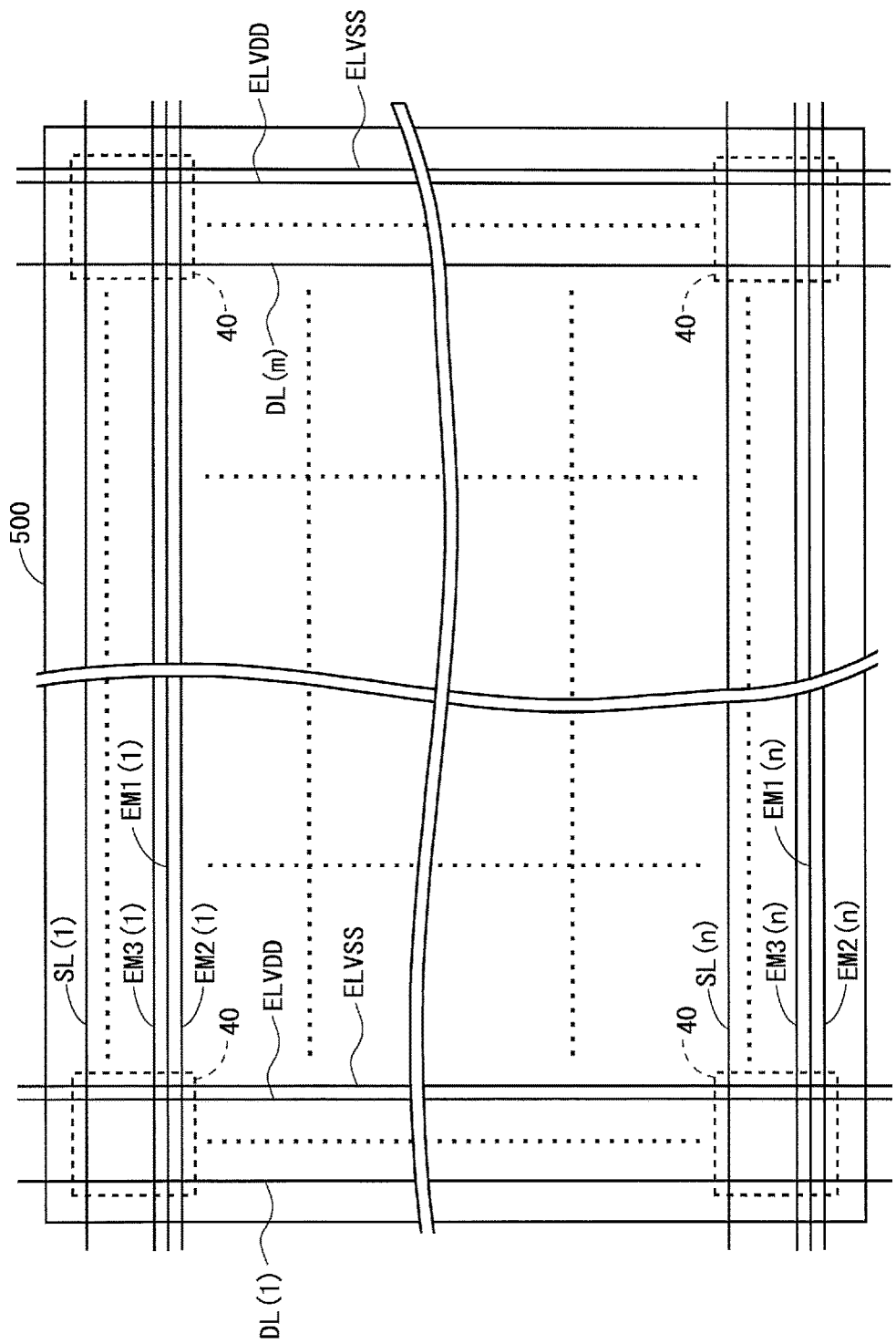
FIG. 3 is a diagram for describing a configuration of a display unit in the first embodiment.

FIG. 3 is a diagram for describing a configuration of the display unit 500 in the present embodiment. In the display unit 500, as shown in FIG. 3, m data lines DL(1) to DL(m) and n scanning signal lines SL(1) to SL(n) are disposed so as to intersect with each other. Pixel circuits 40 are provided at the respective intersections of the data lines DL(1) to DL(m) and the scanning signal lines SL(1) to SL(n). That is, in the display unit 500, the pixel circuits 40 are arranged in a matrix form so as to form rows (n rows) and columns (m columns). In addition, in the display unit 500, n first emission lines EM1(1) to EM1($n$), n second emission lines EM2(1) to EM2($n$), and n third emission lines EM3(1) to EM3($n$) are disposed so as to correspond to the n scanning signal lines SL(1) to SL($n$). Furthermore, in the display unit 500, high-level power supply lines ELVDD and low-level power supply lines ELVSS are disposed. In the present embodiment, the first power supply line is implemented by the high-level power supply lines ELVDD, and the second power supply line is implemented by the low-level power supply lines ELVSS. A detailed configuration of the pixel circuits 40 will be described later.

Note that in the following, when the m data lines DL(1) to DL(m) do not need to be distinguished from each other, the data lines are simply represented by reference character DL. Likewise, the scanning signal lines, the first emission lines, the second emission lines, and the third emission lines are simply represented by reference characters SL, EM1, EM2, and EM3, respectively. In addition, the first to third emission lines EM1 to EM3 are also collectively and simply referred to as "emission line", and the emission line is denoted by reference character EM. In the present embodiment, the light-emission control lines are implemented by the emission lines EM.

As shown in FIG. 2, the display control circuit 100 includes a display mode switching control circuit 110, a resolution switching control circuit 120, a source control circuit 130, and a gate control circuit 140. The display mode switching control circuit 110 provides a display mode switching signal Sm for switching the display mode of the organic EL display device 1 between the high resolution mode and the low resolution mode, to the resolution switching control circuit 120, the source control circuit 130, and the gate control circuit 140. The resolution switching control circuit 120 provides a resolution switching signal Sr for switching the resolution of a display image between the high resolution mode and the low resolution mode, to the source control circuit 130 and provides an emission line selecting signal Se for controlling whether to select each emission line EM, to the gate control circuit 140. The source control circuit 130 outputs display data DA, a source start pulse signal SSP, a source clock signal SCK, and a latch strobe signal LS, which are for controlling the operation of the source driver 200, based on the display mode switching signal Sm and the resolution switching signal Sr. The gate control circuit 140 outputs a gate start pulse signal GSP and a gate clock signal GCK, which are for controlling the operation of the gate driver 300, based on the display mode switching signal Sm. The gate control circuit 140 also outputs first to third emission driver control signals EMCTL1 to EMCTL3 for controlling the operation of the first to third emission drivers 401 to 403, based on the display mode switching signal Sm and the emission line selecting signal Se. In addition, a control signal S1 and a control signal S2 for controlling the on/off of the power supplies are respectively provided to the organic EL high-level power supply 610 and the organic EL low-level power supply 620, from the display control circuit 100.

The source driver 200 receives the display data DA, the source start pulse signal SSP, the source clock signal SCK, and the latch strobe signal LS, which are transmitted from the display control circuit 100, and applies driving video signals to the data lines DL(1) to DL(m).

Figure 4:
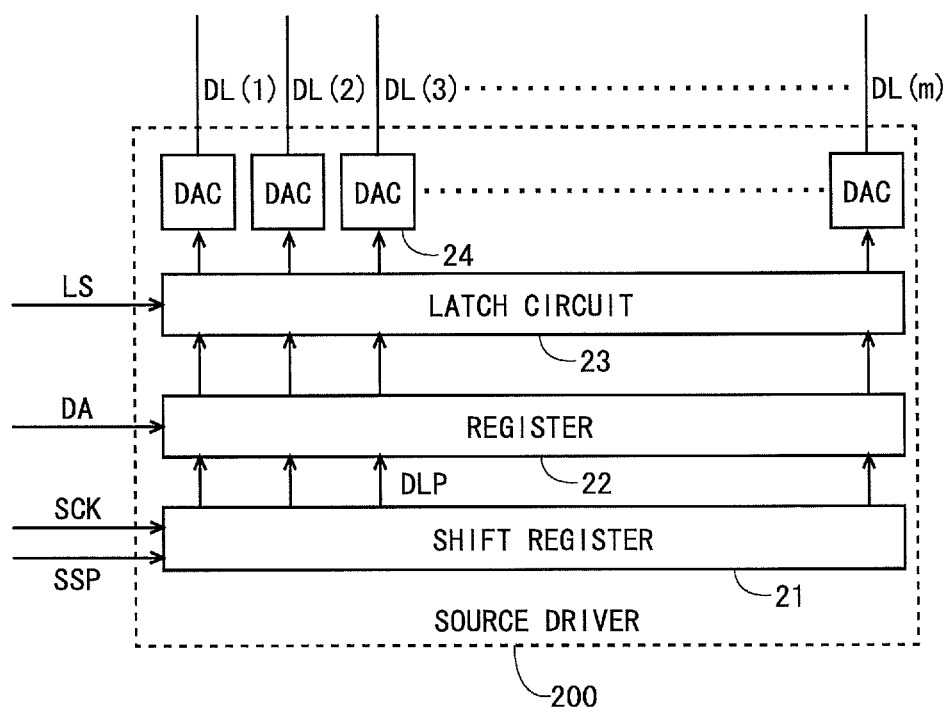
FIG. 4 is a block diagram showing an example of configuration of a source driver in the first embodiment.

FIG. 4 is a block diagram showing an example of configuration of the source driver 200. The source driver 200 includes an m-bit shift register 21, a register 22, a latch circuit 23, and m D/A converters (DAC) 24. The shift register 21 has m cascade-connected registers (not shown). The shift register 21 sequentially transfers a pulse of the source start pulse signal SSP to be supplied to a first-stage register, from an input terminal to an output terminal, based on the source clock signal SCK. In response to the pulse transfer, timing pulses DLP corresponding to the respective data lines DL are output from the shift register 21. Based on the timing pulses DLP, the register 22 stores the display data DA. The latch circuit 23 catches and holds the display data DA for one row which is stored in the register 22, based on the latch strobe signal LS. The D/A converters 24 are provided in such a way that they correspond to the respective data lines DL. The D/A converters 24 convert the display data DA held in the latch circuit 23 into analog voltages. The converted analog voltages are applied as driving video signals to all of the data lines DL(1) to DL(m) at the same time.

The gate driver 300 sequentially applies an active scanning signal to the n scanning signal lines SL(1) to SL(n), based on the gate start pulse signal GSP and the gate clock signal GCK, which are transmitted from the display control circuit 100. Note that, regarding the scanning signal line SL, the state in which an active scanning signal is being applied is referred to as "selected state". The same also applies to the emission line EM. When a scanning signal line SL is in the selected state, writing of data is performed in the pixel circuits 40 corresponding to the scanning signal line SL.

Figure 5:
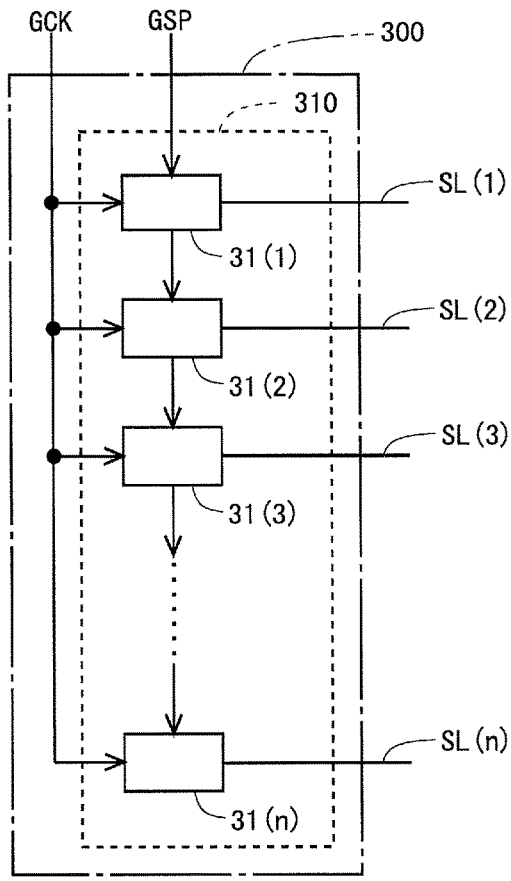
FIG. 5 is a block diagram showing an example of configuration of a gate driver in the first embodiment.

FIG. 5 is a block diagram showing an example of configuration of the gate driver 300 in the present embodiment. The gate driver 300 includes a shift register 310 including n flip-flop circuits 31(1) to 31(n). The shift register 310 is configured such that the gate start pulse signal GSP is provided to a first-stage flip-flop circuit 31(1), and the gate clock signal GCK is provided to all of the flip-flop circuits 31(1) to 31(n) in a shared manner. Output signals outputted from the respective flip-flop circuits 31(1) to 31(n) are provided as scanning signals to the scanning signal lines SL(1) to 31(n).

Figure 6:
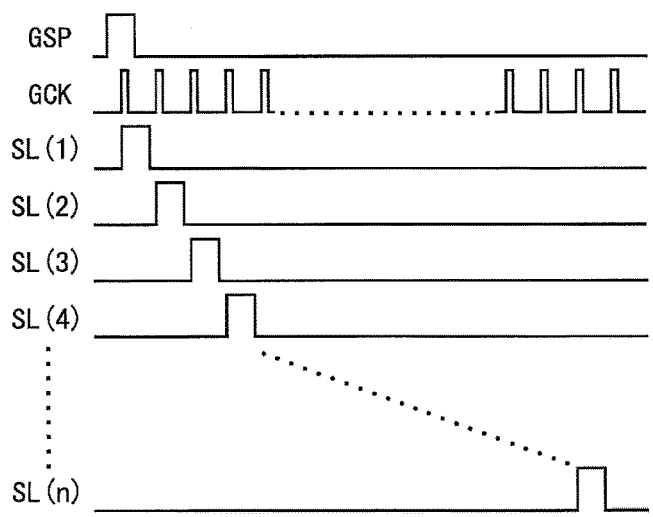
FIG. 6 is a timing chart for describing an operation of the gate driver in the first embodiment.

In the above-described configuration, when a pulse of the gate start pulse signal GSP is provided to the first-stage flip-flop circuit 31(1) of the shift register 310, the pulse included in the gate start pulse signal GSP is sequentially transferred from the first-stage flip-flop circuit 31(1) to an nth-stage flip-flop circuit 31(n), based on the gate clock signal GCK. Then, based on this pulse transfer, scanning signals outputted from the n flip-flop circuits 31(1) to 31(n) sequentially go to a high level. By this, as shown in FIG. 6, the n scanning signal lines SL(1) to SL(n) sequentially go into the selected state for a predetermined period.

The first emission driver 401 applies first light-emission control signals to the n first emission lines EM1(1) to EM1(n) based on the first emission driver control signal EMCTL1, which is transmitted from the display control circuit 100. Note that the first emission driver control signal EMCTL1 includes a first emission start pulse signal ESP1 and a first emission clock signal ECK1.

Figure 7:
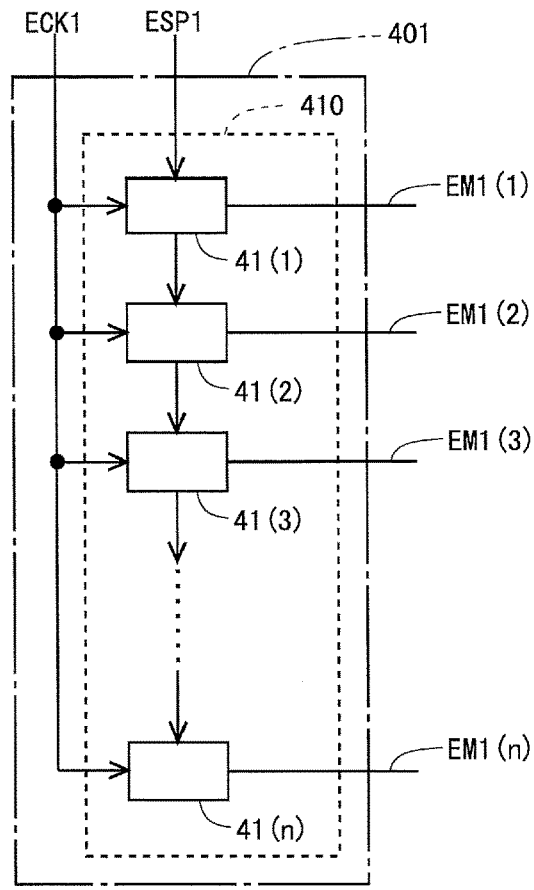
FIG. 7 is a block diagram showing an example of configuration of a first emission driver in the first embodiment.

FIG. 7 is a block diagram showing an example of configuration of a first emission driver 401 in the present embodiment. The first emission driver 401 includes a shift register 410 including n flip-flop circuits 41(1) to 41(n). As understood from FIG. 5 and FIG. 7, the first emission driver 401 has the same configuration as the gate driver 300. Output signals outputted from the respective flip-flop circuits 41(1) to 41(n) are provided as first light-emission control signals to the first emission lines EM1(1) to EM1(n).

Figure 8:
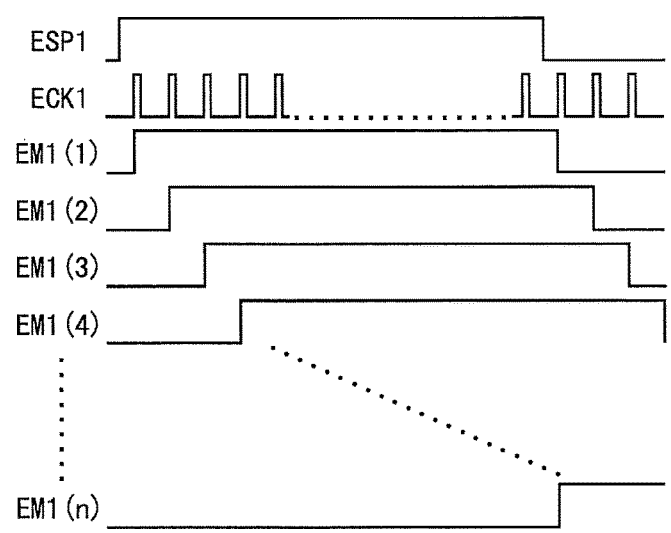
FIG. 8 is a timing chart for describing an operation of the first emission driver in the first embodiment.

In the above-described configuration, when a pulse of the first emission start pulse signal ESP1 is provided to the first-stage flip-flop circuit 41(1) of the shift register 410, the pulse included in the first emission start pulse signal ESP1 is sequentially transferred from the first-stage flip-flop circuit 41(1) to an nth-stage flip-flop circuit 41(n), based on the first emission clock signal ECK1. Then, based on this pulse transfer, the first light-emission control signals outputted from the n flip-flop circuits 41(1) to 41(n) sequentially go to a high level. By this, as shown in FIG. 8, then first emission lines EM1(1) to EM1(n) sequentially go into the selected state. Note that, as understood from FIG. 6 and FIG. 8, the gate start pulse signal GSP is set such that a pulse width thereof is relatively short and the first emission start pulse signal ESP1 is set such that a pulse width thereof is relatively long. Accordingly, although multiple lines do not go into the selected state at the same time regarding the scanning signal lines SL, multiple lines may go into the selected state at the same time regarding the first emission lines EM1 (see FIGS. 6 and 8).

The configurations and the operations of the second emission driver 402 and the third emission driver 403 are the same as those of the first emission driver 401 and thus a description thereof is omitted.

In the above-described manner, driving video signals are applied to the m data lines DL(1) to DL(m), scanning signals are applied to the n scanning signal lines SL(1) to SL(n), first light-emission control signals are applied to the n first emission lines EM1(1) to EM1(n), second light-emission control signals are applied to the n second emission lines EM2(1) to EM2(n), and third light-emission control signals are applied to the n third emission lines EM3(1) to EM3(n), by which image display on the display unit 500 is performed. Note that in the following the first to third light-emission control signals are also collectively and simply referred to as "light-emission control signal".

<1.2 Arrangement of Pixels>

Figure 1:
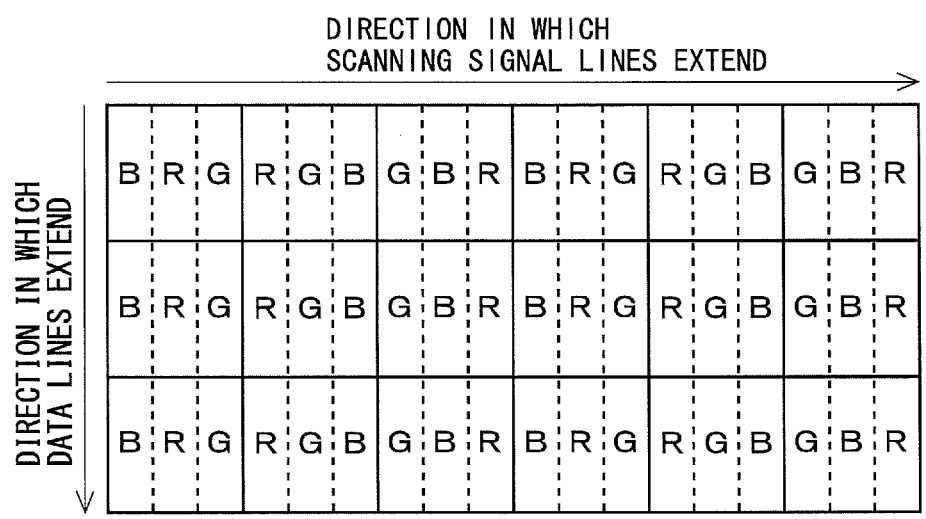
FIG. 1 is a schematic diagram showing an arrangement of pixels in an active matrix-type organic EL display device according to a first embodiment of the present invention.
Figure 9:
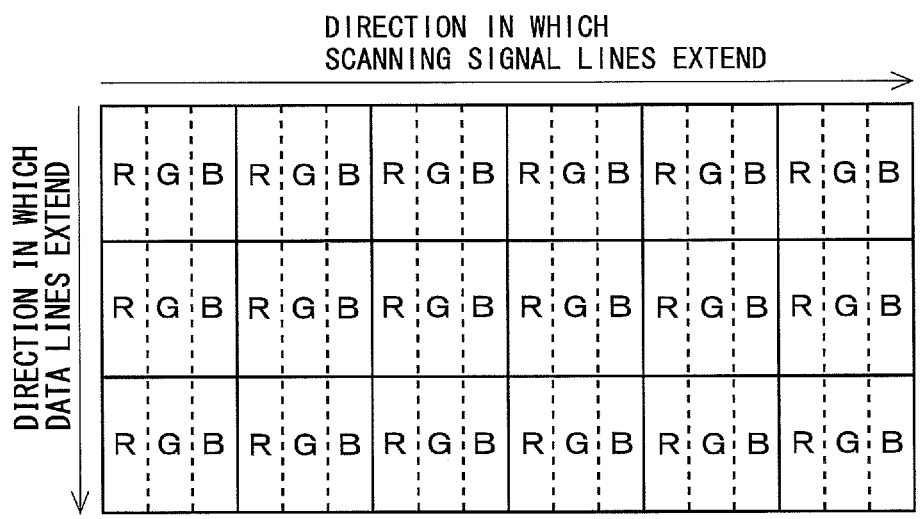
FIG. 9 is a schematic diagram showing an arrangement of pixels in a conventional example.

Next, an arrangement of pixels (an alignment sequence of subpixels) in the present embodiment will be described comparing it with an arrangement of pixels in a conventional configuration. FIG. 1 is a schematic diagram showing an arrangement of pixels in the present embodiment. FIG. 9 is a schematic diagram showing an arrangement of pixels in a conventional example. Note that, in FIG. 1 and FIG. 9, "R" represents an R subpixel that displays red, "G" represents a G subpixel that displays green, and "B" represents a B subpixel that displays blue.

As shown in FIG. 9, in the conventional configuration, subpixels aligned in the order of "R subpixel, G subpixel, and B subpixel" are repeatedly provided in an extension direction of the scanning signal lines SL. On the other hand, in the present embodiment, as shown in FIG. 1, subpixels aligned in the order of "B subpixel, R subpixel, G subpixel, R subpixel, G subpixel, B subpixel, G subpixel, B subpixel, and R subpixel" are repeatedly provided in an extension direction of the scanning signal lines SL. Note that, both in the conventional configuration and in the present embodiment, one pixel includes three subpixels, and one pixel corresponds to one pixel circuit 40. Regarding an extension direction of the data lines DL, both in the conventional configuration and in the present embodiment, subpixels for the same color are repeatedly provided. As described above, in the present embodiment, an alignment sequence of subpixels regarding an extension direction of the scanning signal lines SL is different from that in the conventional configuration.

In the present embodiment, in the above-described configuration, three pixels (nine subpixels) arranged in a direction in which the scanning signal lines SL extend are defined as one group. That is, three pixel circuits 40 are defined as one group. Since the number of columns is m, (m/3) groups are formed for each row. When the display mode is the low resolution mode, one pixel is formed by three pixel circuits 40 included in each group. When the display mode is the high resolution mode, one pixel is formed by one pixel circuit 40.

Figure 10:
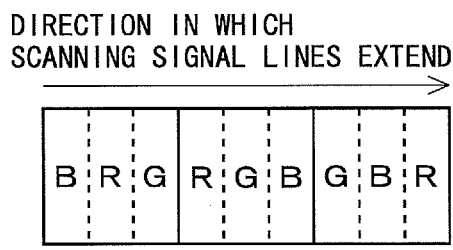
FIG. 10 is a schematic diagram showing a configuration of subpixel group forming one group in the first embodiment.
Figure 11:
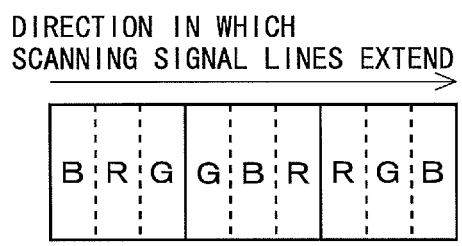
FIG. 11 is a schematic diagram showing another configuration of subpixel group forming one group in the first embodiment.
Figure 12:
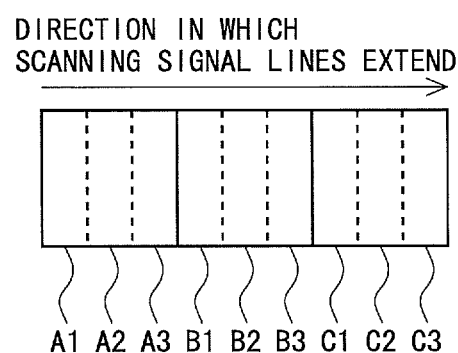
FIG. 12 is a diagram for describing a configuration of subpixel group forming one group in the first embodiment.

As understood from FIG. 1, in the present embodiment, a configuration of subpixel group forming one group is as shown in FIG. 10. However, the present invention is not limited to this. For example, a configuration of subpixel group forming one group may be as shown in FIG. 11. More specifically, the configuration may be such that, when each of subpixels forming one group is denoted by reference character as shown in FIG. 12, "subpixel A1, subpixel B1, and subpixel C1" and "R subpixel, G subpixel, and B subpixel" correspond to each other on a one-to-one basis (in no particular order), "subpixel A2, subpixel B2, and subpixel C2" and "R subpixel, G subpixel, and B subpixel" correspond to each other on a one-to-one basis (in no particular order), and "subpixel A3, subpixel B3, and subpixel C3" and "R subpixel, G subpixel, and B subpixel" correspond to each other on a one-to-one basis (in no particular order). Note that it is assumed that each of "subpixels A1 to A3", "subpixels B1 to B3", and "subpixels C1 to C3" constitutes subpixels of three colors.

<1.3 Configuration of the Pixel Circuit>

Figure 13:
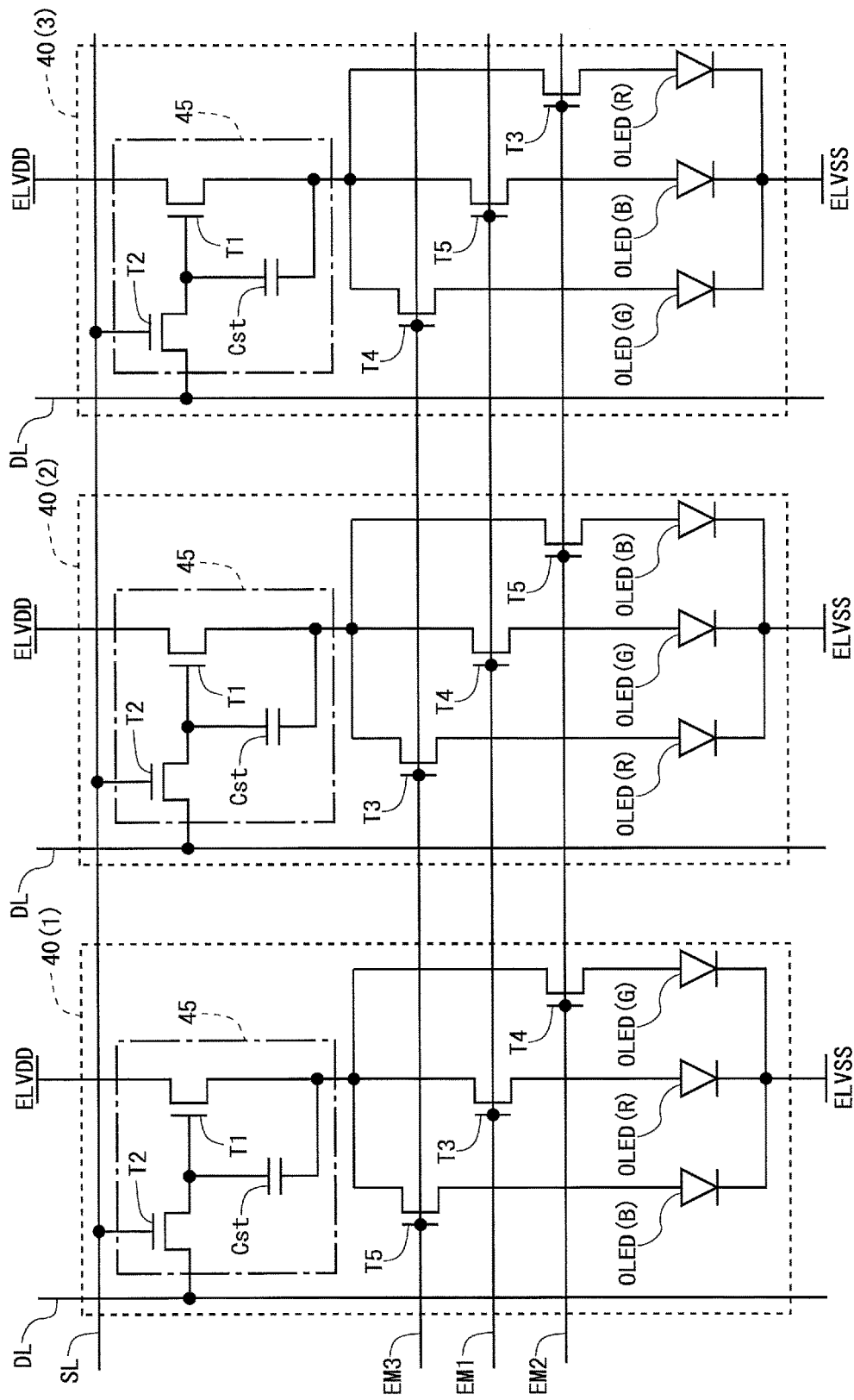
FIG. 13 is a circuit diagram showing a configuration of three pixel circuits included in one group in the first embodiment.
Figure 14:
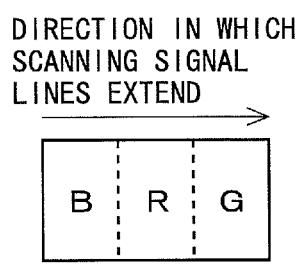
FIG. 14 is a diagram for describing an arrangement of subpixels in the first embodiment.
Figure 15:
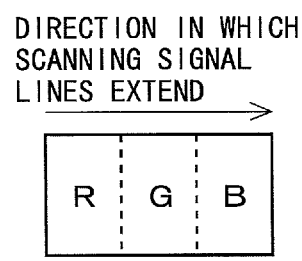
FIG. 15 is a diagram for describing an arrangement of subpixels in the first embodiment.
Figure 16:
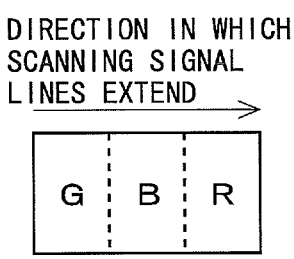
FIG. 16 is a diagram for describing an arrangement of subpixels in the first embodiment.

FIG. 13 is a circuit diagram showing a configuration of three pixel circuits 40(1) to 40(3) included in one group. Each of these three pixel circuits 40(1) to 40(3) forms one pixel for when the display mode is the high resolution mode. The pixel circuit 40(1) is configured such that subpixels are aligned in the order of "B subpixel, R subpixel, and G subpixel" (see FIG. 14) in an extension direction of the scanning signal lines SL. The pixel circuit 40(2) is configured such that subpixels are aligned in the order of "R subpixel, G subpixel, and B subpixel" (see FIG. 15) in an extension direction of the scanning signal lines SL. The pixel circuit 40(3) is configured such that subpixels are aligned in the order of "G subpixel, B subpixel, and R subpixel" (see FIG. 16) in an extension direction of the scanning signal lines SL.

As shown in FIG. 13, each of the pixel circuits 40(1) to 40(3) includes five transistors T1 to T5, one capacitor Cst, and three organic EL elements OLED(R), OLED(G), and OLED(B). The transistor T1 is a drive transistor and the transistor T2 is an input transistor. The transistors T3, T4, and T5 function as light-emission control transistors that perform light emission control by controlling the supply of a drive current to the organic EL elements OLED(R), OLED(G), and OLED(B), respectively. The organic EL element OLED(R) functions as an electro-optical element that emits red light. The organic EL element OLED(G) functions as an electro-optical element that emits green light. The organic EL element OLED(B) functions as an electro-optical element that emits blue light. In the following, the three organic EL elements OLED(R), OLED(G), and OLED(B) are also collectively and simply referred to as "organic EL element OLED".

Note that in the present embodiment the drive current control unit 45 that controls a drive current for bringing the organic EL elements OLED into a light-emitting state is implemented by the transistor T1, the transistor T2, and the capacitor Cst.

As shown in FIG. 13, the transistor T1 is provided in series with each of the transistors T3 to T5 and in series with each of the organic EL elements OLED(R), OLED(G), and OLED(B). In other words, the transistor T1 and the organic EL element OLED(R) are connected in series with each other through the transistor T3, the transistor T1 and the organic EL element OLED(G) are connected in series with each other through the transistor T4, and the transistor T1 and the organic EL element OLED(B) are connected in series with each other through the transistor T5. The transistor T1 is connected at its gate terminal to a drain terminal of the transistor T2, connected at its drain terminal to the high-level power supply line ELVDD, and connected at its source terminal to drain terminals of the transistors T3 to T5. The transistor T2 is provided between the data line DL and the gate terminal of the transistor T1. The transistor T2 is connected at its gate terminal to the scanning signal line SL, connected at its drain terminal to the gate terminal of the transistor T1, and connected at its source terminal to the data line DL. The capacitor Cst is connected at its one end to the gate terminal of the transistor T1 and connected at its other end to the source terminal of the transistor T1. The transistor T3 is connected at its drain terminal to the source terminal of the transistor T1 and connected at its source terminal to an anode terminal of the organic EL element OLED(R). The transistor 14 is connected at its drain terminal to the source terminal of the transistor T1 and connected at its source terminal to an anode terminal of the organic EL element OLED(G). The transistor T5 is connected at its drain terminal to the source terminal of the transistor T1 and connected at its source terminal to an anode terminal of the organic EL element OLED(B). Each of gate terminals of the transistors T3 to T5 is connected to any of the first to third emission lines EM1 to EM3. Note that a specific connection relationship between the first to third emission lines EM1 to EM3 and the gate terminals of the transistors T3 to T5 will be described later. Cathode terminals of the organic EL elements OLED(R), OLED(G), and OLED(B) are connected to the organic EL low-level power supply line ELVSS.

Here, a connection relationship between the first to third emission lines EM1 to EM3 and the gate terminals of the transistors T3 to T5 included in the three pixel circuits 40(1) to 40(3) will be described. The first emission line EM1 is connected to the gate terminal of the transistor T3 in the pixel circuit 40(1), the gate terminal of the transistor T4 in the pixel circuit 40(2), and the gate terminal of the transistor T5 in the pixel circuit 40(3). The second emission line EM2 is connected to the gate terminal of the transistor T4 in the pixel circuit 40(1), the gate terminal of the transistor T5 in the pixel circuit 40(2), and the gate terminal of the transistor T3 in the pixel circuit 40(3). The third emission line EM3 is connected to the gate terminal of the transistor T5 in the pixel circuit 40(1), the gate terminal of the transistor T3 in the pixel circuit 40(2), and the gate terminal of the transistor T4 in the pixel circuit 40(3). As such, each of the first to third emission lines EM1 to EM3 is connected to the gate terminals of transistors corresponding to organic EL elements OLED having respective light-emitting colors different from one another in the three pixel circuits 40(1) to 40(3).

In the present embodiment, all of the transistors T1 to T5 in the pixel circuit 40 are of the n-channel type. Moreover, in the present embodiment, for the transistors T1 to T5, oxide TFTs (thin film transistors using an oxide semiconductor for channel layers) are adopted.

A description is made below of an oxide semiconductor layer included in each of the oxide TFTs. The oxide semiconductor layer is, for example, an In—Ga—Zn—O-based semiconductor layer. The oxide semiconductor layer contains, for example, an In—Ga—Zn—O-based semiconductor. The In—Ga—Zn—O-based semiconductor is a ternary oxide of In (indium), Ga (gallium) and Zn (zinc). A ratio (composition ratio) of In, Ga and Zn is not particularly limited. For example, the composition ratio may be In:Ga:Zn=2:2:1, In:Ga:Zn=1:1:1, In:Ga:Zn=1:1:2, and the like.

Such a TFT including the In—Ga—Zn—O-based semiconductor layer has high mobility (mobility exceeding 20 times that of an amorphous silicon TFT) and a low leak current (leak current of less than $\frac{1}{100}$ of that of the amorphous silicon TFT). Accordingly, this TFT is suitably used as a drive TFT (the above-described transistor T1) in the pixel circuit 40 and a switching TFT (the above-described transistor T2) therein. When the TFT including the In—Ga—Zn—O-based semiconductor layer is used, power consumption of the display device can be reduced to a great extent.

The In—Ga—Zn—O-based semiconductor may be amorphous, or may include a crystalline portion and have crystallinity. As the crystalline In—Ga—Zn—O-based semiconductor, a crystalline In—Ga—Zn—O-based semiconductor, in which a c-axis is oriented substantially perpendicularly to a layer surface, is preferable. A crystal structure of the In—Ga—Zn—O-based semiconductor as described above is disclosed, for example, in Japanese Patent Application Laid-Open No. 2012-134475.

The oxide semiconductor layer may contain other oxide semiconductors in place of the In—Ga—Zn—O-based semiconductor. For example, the oxide semiconductor layer may contain a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, a CdO (cadmium oxide), a Mg—Zn—O-based semiconductor, an In—Sn—Zn—O-based semiconductor (for example, $In_2O_3$—$SnO_2$—ZnO), an In—Ga—Sn—O-based semiconductor and the like.

<1.4 Driving Method>

Next, a driving method in the present embodiment will be described.

<1.4.1 Summary>

Figure 17:
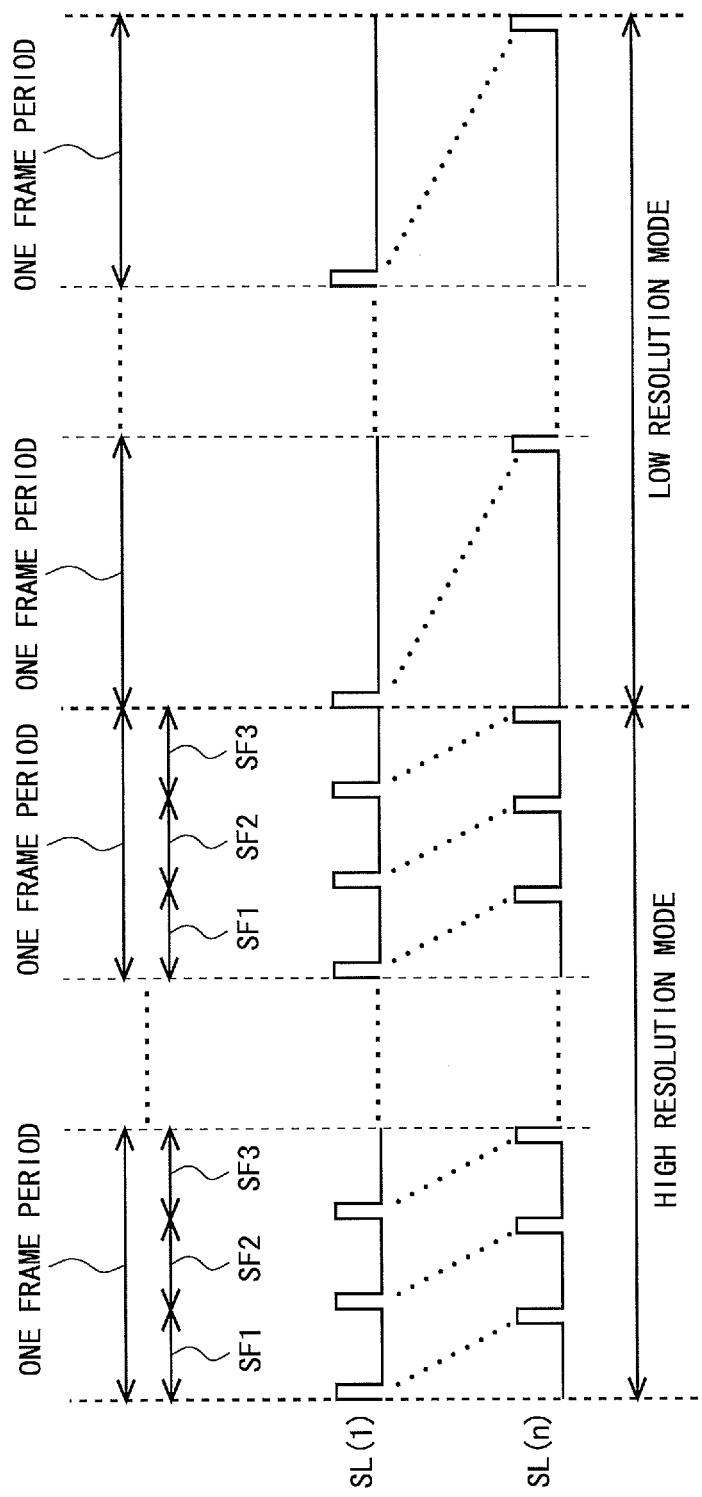
FIG. 17 is a diagram for describing a summary of a driving method in the first embodiment.

FIG. 17 is a diagram for describing a summary of a driving method in the present embodiment. As described above, the organic EL display device 1 according to the present embodiment switches the display mode between the high resolution mode and the low resolution mode. When the display mode is the high resolution mode, the time-division driving that divides one frame period into three sub-frames SF1 to SF3 is performed. On the other hand, when the display mode is the low resolution mode, general driving in which one vertical scanning is performed over one frame period is performed.

Regarding the display mode, for example, in a mobile phone and so on adopting this organic EL display device 1, image display is performed by the high resolution mode at normal times. Then, when an image not required to display with high-resolution, such as an image representing a calendar and a clock and so on, is displayed, the display mode is switched from the high resolution mode to the low resolution mode. Thereafter, when an image required to display with high-resolution, the display mode is switched from the low resolution mode to the high resolution mode. Note that the high resolution display step is implemented by operation performed when in the high resolution mode, and the low resolution display step is implemented by operation performed when in the low resolution mode.

<1.4.2 Operation Performed when in the High Resolution Mode>

Figure 18:
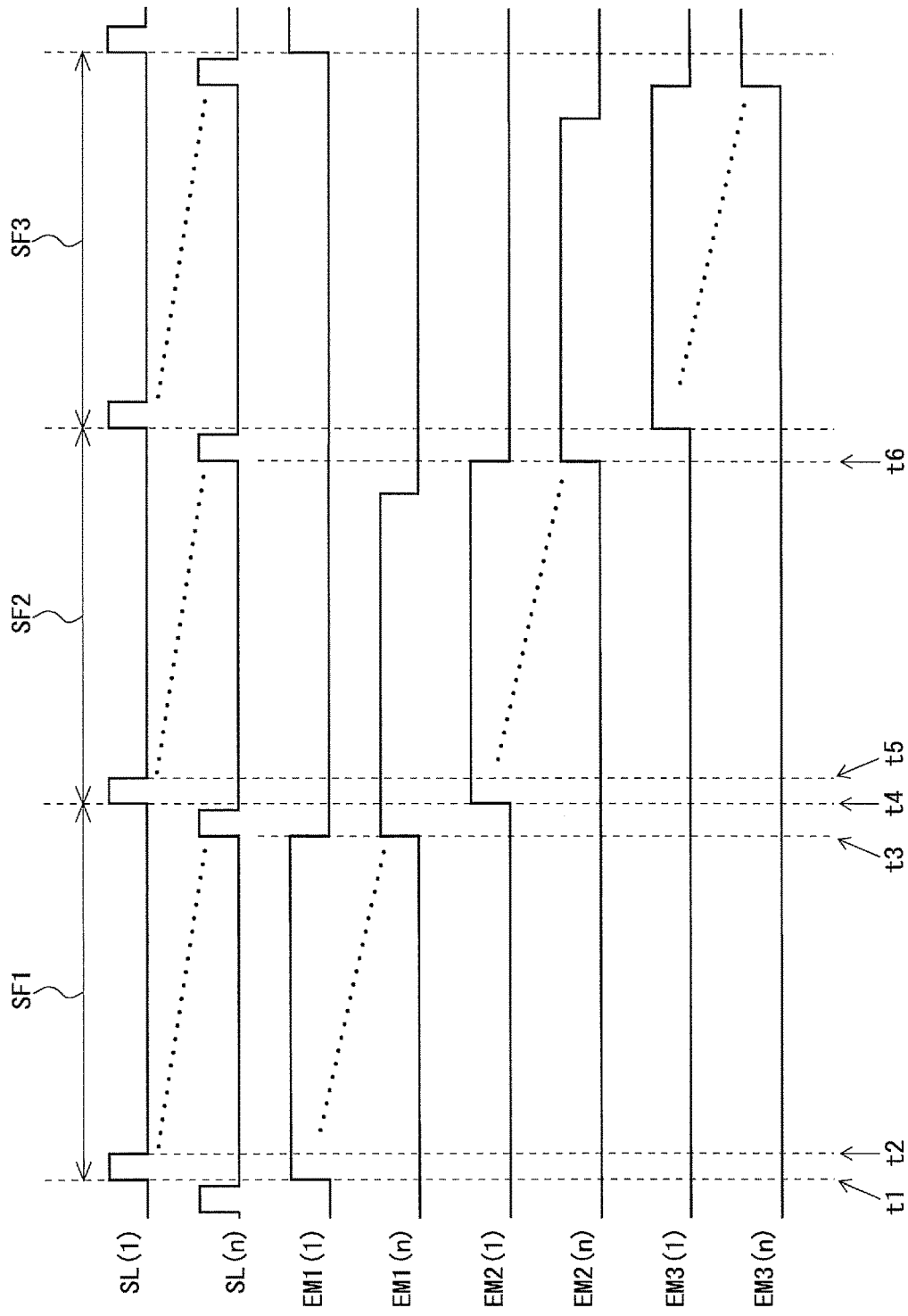
FIG. 18 is a timing chart showing the waveforms of scanning signals and light-emission control signals for when the display mode is a high resolution mode in the first embodiment.

FIG. 18 is a timing chart showing the waveforms of scanning signals and light-emission control signals for when the display mode is a high resolution mode. In the first sub-frame SF1, first, as for the first row, the emission driver brings the first emission line EM1(1) into the selected state and keeps the second emission line EM2(1) and the third emission line EM3(1) in the non-selected state. By this, in the first row, the transistor T3 goes into an on state and the transistors T4 and T5 go into an off state in the pixel circuit 40(1), the transistor T4 goes into an on state and the transistors T3 and T5 go into an off state in the pixel circuit 40(2), and the transistor T5 goes into an on state and the transistors T3 and T4 go into an off state in the pixel circuit 40(3) (see FIG. 13). In the above-described state, the gate driver 300 brings the scanning signal line SL(1) into the selected state. By this, in each pixel circuit 40 in the first row, the transistor T2 goes into an on state. As a result, in each pixel circuit 40 in the first row, the capacitor Cst is charged based on a data voltage applied to the data line DL. When the gate driver 300 brings the scanning signal line SL(1) into the non-selected state, in each pixel circuit 40 in the first row, the transistor T2 goes into an off state. By this, a gate-source voltage Vgs held in the capacitor Cst is fixed. In each pixel circuit 40 in the first row, a drive current depending on the magnitude of the gate-source voltage Vgs flows between the drain and source of the transistor T1. Meanwhile, as described above, the first emission line EM1(1) is connected to the gate terminal of the transistor T3 in the pixel circuit 40(1), the gate terminal of the transistor T4 in the pixel circuit 40(2), and the gate terminal of the transistor T5 in the pixel circuit 40(3). Therefore, the drive current is supplied to the organic EL element OLED(R) through the transistor T3 in the pixel circuit 40(1), the drive current is supplied to the organic EL element OLED(G) through the transistor T4 in the pixel circuit 40(2), and the drive current is supplied to the organic EL element OLED (B) through the transistor T5 in the pixel circuit 40(3). As a result, the organic EL element OLED(R) emits light in the pixel circuit 40(1), the organic EL element OLED(G) emits light in the pixel circuit 40(2), and the organic EL element OLED(B) emits light in the pixel circuit 40(3). The emission driver keeps the first emission line EM1(1) in the selected state during a period corresponding to one sub-frame.

Operation such as that described above is sequentially performed for the second to nth rows. Furthermore, in the second sub-frame SF2 and the third sub-frame SF3, too, the same operation as that of the first sub-frame SF1 is performed. Note, however, that the emission driver sequentially brings the n second emission lines EM2(1) to EM2(n) into the selected state in the second sub-frame SF2, and the emission driver sequentially brings the n third emission lines EM3(1) to EM3(n) into the selected state in the third sub-frame SF3.

Figure 19:
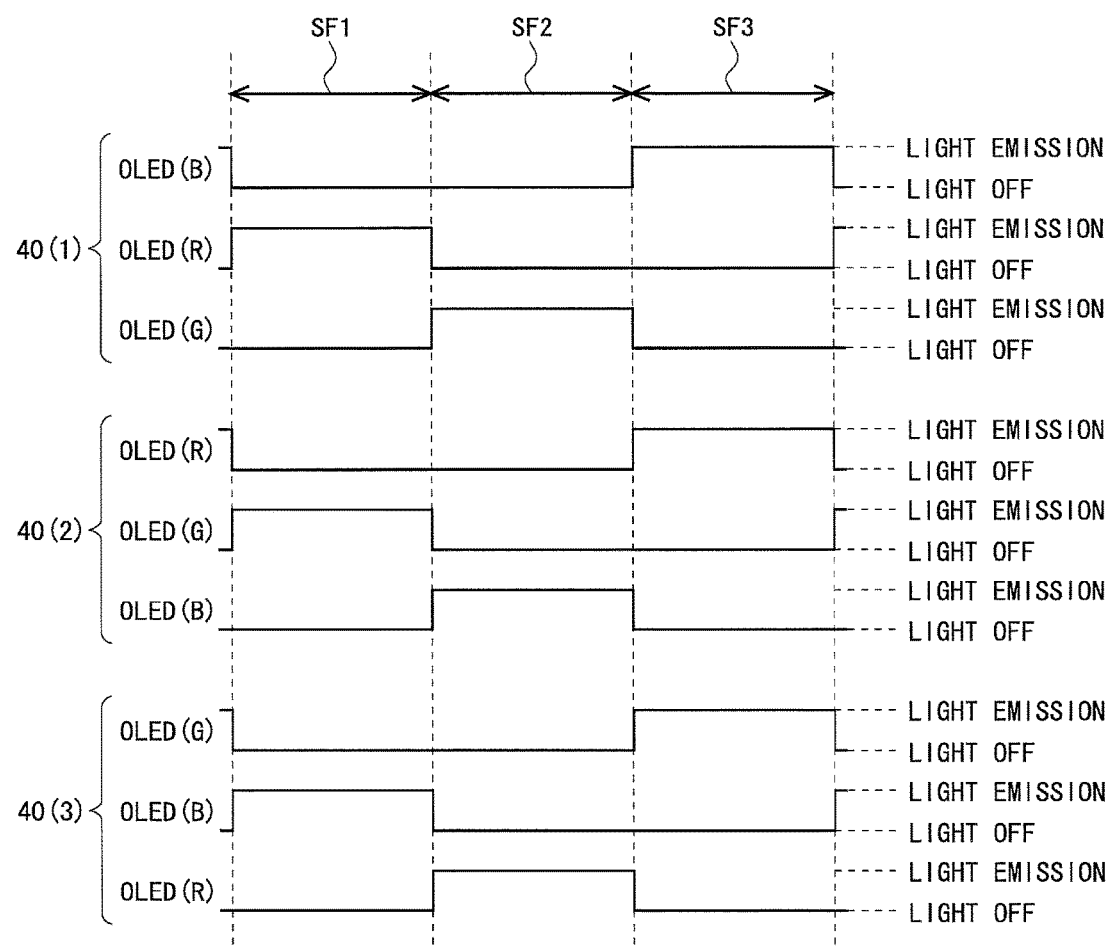
FIG. 19 is a diagram showing the transitions of the light-emitting states of organic EL elements in three pixel circuits included in one group for when the display mode is the high resolution mode in the first embodiment.

By the above, the transitions of the light-emitting states of the organic EL elements OLED in the three pixel circuits 40(1) to 40(3) included in one group are as follows (see FIG. 19). In the pixel circuit 40(1), only the red-color organic EL element OLED(R) goes into a light-emitting state in the first sub-frame SF1, only the green-color organic EL element OLED(G) goes into a light-emitting state in the second sub-frame SF2, and only the blue-color organic EL element OLED(B) goes into a light-emitting state in the third sub-frame SF3. In the pixel circuit 40(2), only the green-color organic EL element OLED(G) goes into a light-emitting state in the first sub-frame SF1, only the blue-color organic EL element OLED(B) goes into a light-emitting state in the second sub-frame SF2, and only the red-color organic EL element OLED(R) goes into a light-emitting state in the third sub-frame SF3. In the pixel circuit 40(3), only the blue-color organic EL element OLED(B) goes into a light-emitting state in the first sub-frame SF1, only the red-color organic EL element OLED(R) goes into a light-emitting state in the second sub-frame SF2, and only the green-color organic EL element OLED(G) goes into a light-emitting state in the third sub-frame SF3.

Figures 20, 21, 22:
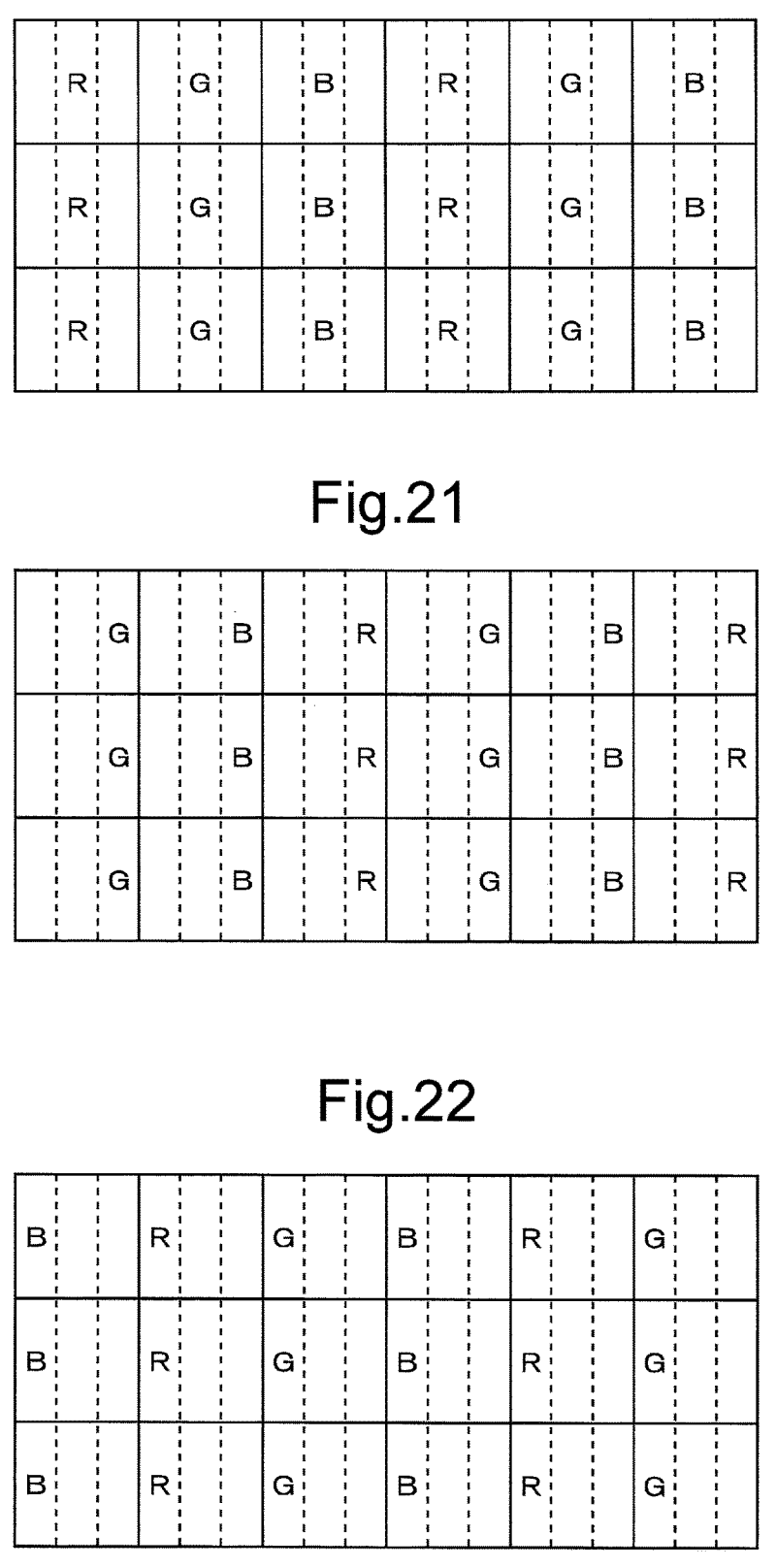

As a result, when focusing on pixel circuits 40 in 3 rows×3 columns, light-emitting states are as shown in FIG. 20 in the first sub-frame SF1, light-emitting states are as shown in FIG. 21 in the second sub-frame SF2, and light-emitting states are as shown in FIG. 22 in the third sub-frame SF3. Note that, in FIGS. 20 to 22, subpixels corresponding to organic EL element OLED brought into a light-emitting state are represented by R, G, or B, and subpixels corresponding to organic EL element OLED brought into a light-off state are represented by blank (the same applies to FIG. 27 and FIGS. 29 to 32).

When the display mode is the high resolution mode, the above-described transitions of the light-emitting states are repeated. On this occasion, switching of the light-emitting states among three pattern shown in FIGS. 20 to 22 is performed in a very short time for human eyes. Accordingly, a color image in which one pixel is formed by one pixel circuit 40 (three subpixels) is displayed on the display unit 500. Note that, although an arrangement of pixels (an alignment sequence of subpixels) in the present embodiment (see FIG. 1) is different from an arrangement of pixels in the conventional example (see FIG. 9), viewers do not seem to feel uncomfortable with a display image when the resolution thereof is greater than or equal to 400 ppi.

Meanwhile, in a period immediately before writing of image data is performed in each row, the emission driver brings all of the emission lines EM corresponding to the row in which the writing is performed into the non-selected state. For example, focusing on the first row, while writing of image data for the first sub-frame SF1 is performed during time t1 to time t2 in FIG. 18, the first emission line EM1(1) is maintained in the selected state during time t1 to time t3. In addition, while writing of image data for the second sub-frame SF2 is performed during time t4 to time t5, the second emission line EM2(1) is maintained in the selected state during time t4 to time t6. Here, during time t3 to time t4, all of the emission lines EM1(1), EM2(1), and EM3(1) corresponding to the first row are in the non-selected state. Accordingly, during time t3 to time t4, all of the organic EL element OLED included in the pixel circuit 40 in the first row are brought into the light-off state. In this way, in each pixel circuit 40, the organic EL element OLED included in the pixel circuit is temporarily brought into the light-off state when writing of image data is performed. In the above-described manner, display in each sub-frame is suppressed from being affected by display in the preceding sub-frame.

<1.4.3 Operation Performed when in the Low Resolution Mode>

Figure 23:
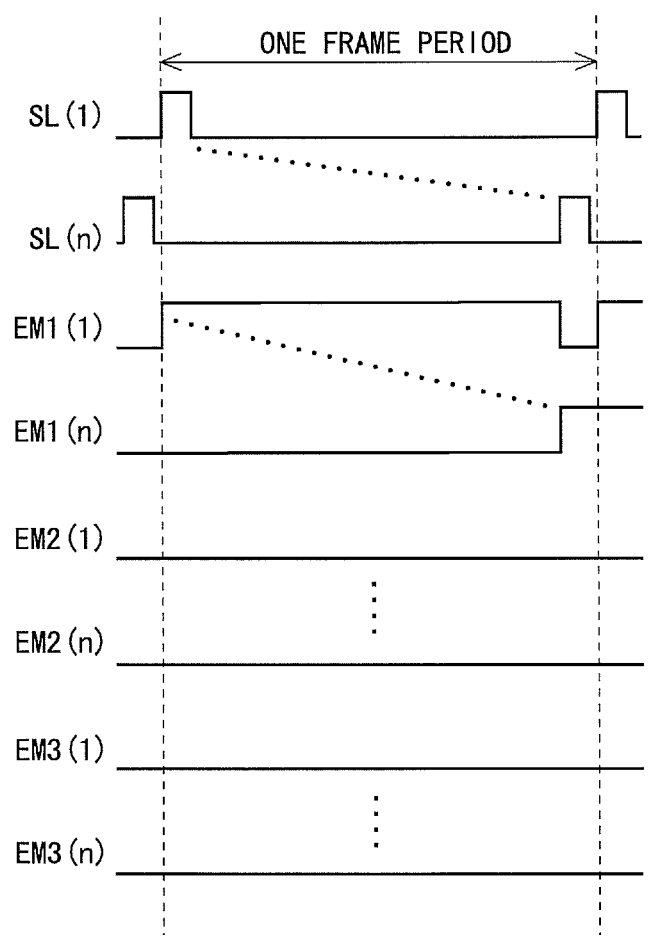
FIG. 23 is a timing chart showing the waveforms of scanning signals and light-emission control signals for when the display mode is a low resolution mode in the first embodiment.

FIG. 23 is a timing chart showing the waveforms of scanning signals and light-emission control signals for when the display mode is a low resolution mode. Note that, although one of the first emission line EM1, the second emission line EM2, and the third emission line EM3 goes into the selected state in each frame period, FIG. 23 shows an example in which the first emission line EM1 goes into the selected state.

When a frame period starts, first, as for the first row, the emission driver brings the first emission line EM1(1) into the selected state and keeps the second emission line EM2(1) and the third emission line EM3(1) in the non-selected state. By this, in the first row, the transistor T3 goes into an on state and the transistors T4 and T5 go into an off state in the pixel circuit 40(1), the transistor T4 goes into an on state and the transistors T3 and T5 go into an off state in the pixel circuit 40(2), and the transistor T5 goes into an on state and the transistors T3 and T4 go into an off state in the pixel circuit 40(3) (see FIG. 13). In the above-described state, the gate driver 300 brings the scanning signal line SL(1) into the selected state. By this, in each pixel circuit 40 in the first row, the capacitor Cst is charged based on a data voltage applied to the data line DL. When the gate driver 300 brings the scanning signal line SL(1) into the non-selected state, in each pixel circuit 40 in the first row, the transistor T2 goes into an off state. By this, a gate-source voltage Vgs held in the capacitor Cst is fixed. In each pixel circuit 40 in the first row, a drive current depending on the magnitude of the gate-source voltage Vgs flows between the drain and source of the transistor T1. As a result, the organic EL element OLED(R) emits light in the pixel circuit 40(1), the organic EL element OLED(G) emits light in the pixel circuit 40(2), and the organic EL element OLED(B) emits light in the pixel circuit 40(3). The emission driver keeps the first emission line EM1(1) in the selected state during a period corresponding to almost one frame period. Operation such as that described above is sequentially performed for the second to nth rows.

Figure 24:
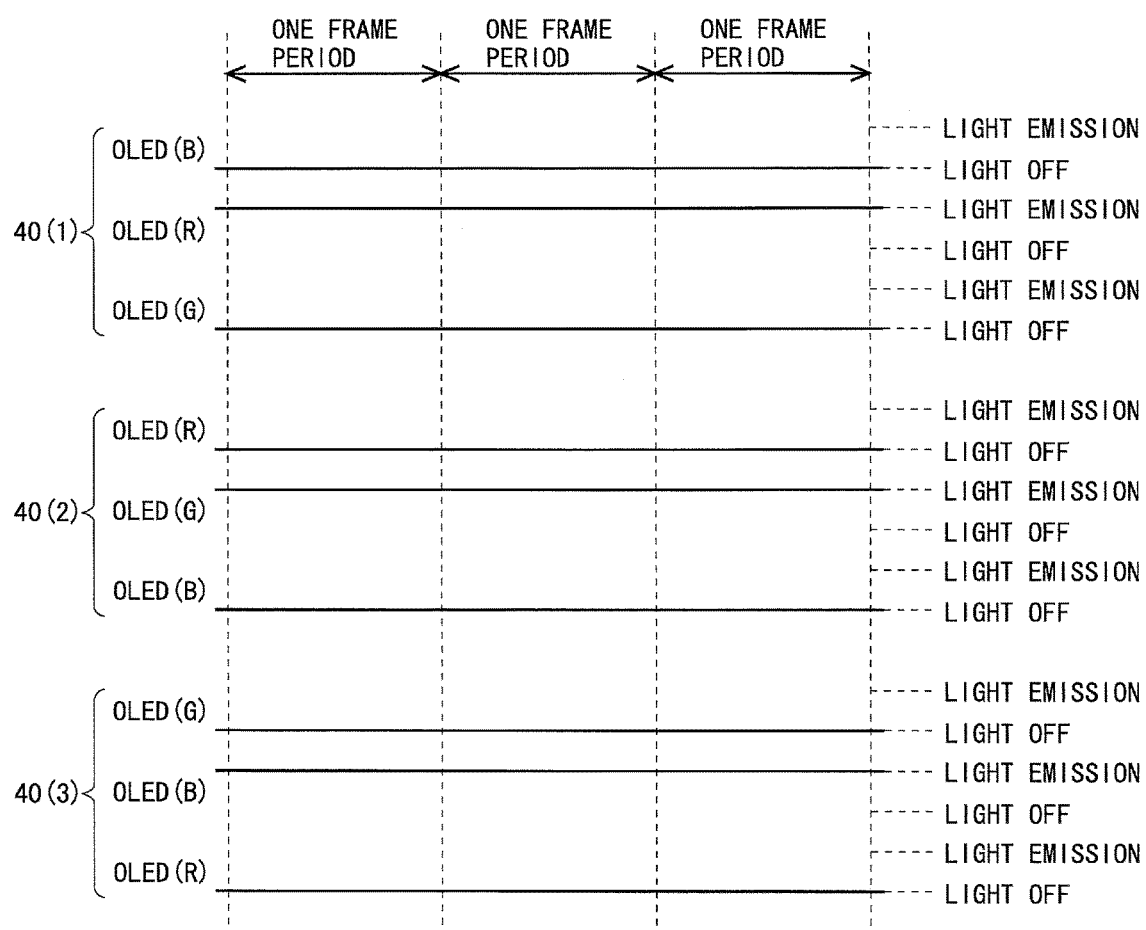
FIG. 24 is a diagram showing the transitions of the light-emitting states of organic EL elements in three pixel circuits included in one group for when the display mode is the low resolution mode in the first embodiment.

By the above, the transitions of the light-emitting states of the organic EL elements OLED in the three pixel circuits 40(1) to 40(3) included in one group are as follows (see FIG. 24). In the pixel circuit 40(1), only the red-color organic EL element OLED(R) goes into a light-emitting state. In the pixel circuit 40(2), only the green-color organic EL element OLED(G) goes into a light-emitting state. In the pixel circuit 40(3), only the blue-color organic EL element OLED(B) goes into a light-emitting state. That is, when the display mode is the low resolution mode, the organic EL elements OLED for multiple colors does not sequentially emit light in each pixel circuit 40, unlike when the display mode is the high resolution mode. By the above, on the display unit 500 is displayed an image in a state in which one pixel is formed by three pixel circuits 40(1) to 40(3) included in one group, namely an image in a state in which one pixel is formed by nine subpixels (note that only three subpixels are brought into the light-emitting state).

Figure 25:
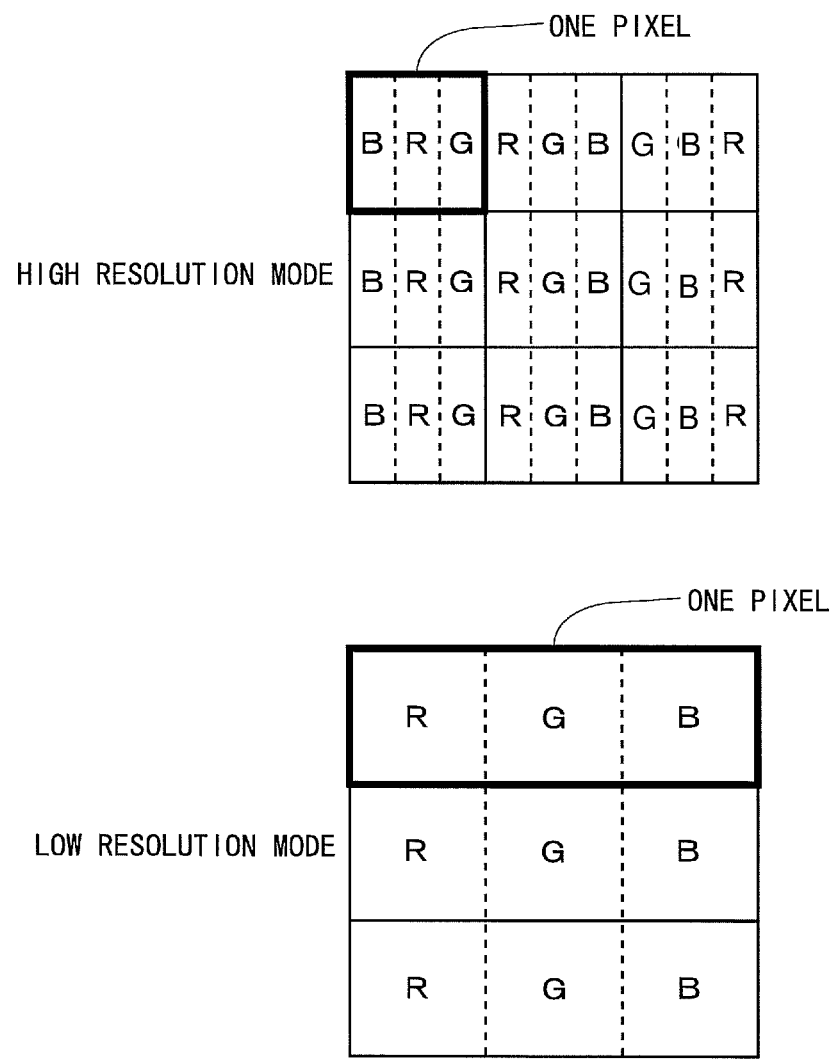
FIG. 25 is a diagram for comparing one pixel when in the high resolution mode with one pixel when in the low resolution mode in the first embodiment.

As shown in FIG. 25, one pixel in the high resolution mode corresponds to one subpixel in the low resolution mode, and one pixel in the low resolution mode corresponds to three subpixels in the high resolution mode. In this manner, when in the low resolution mode, an image with a ⅓ resolution of an image displayed when in the high resolution mode is displayed on the display unit 500.

Figure 26:
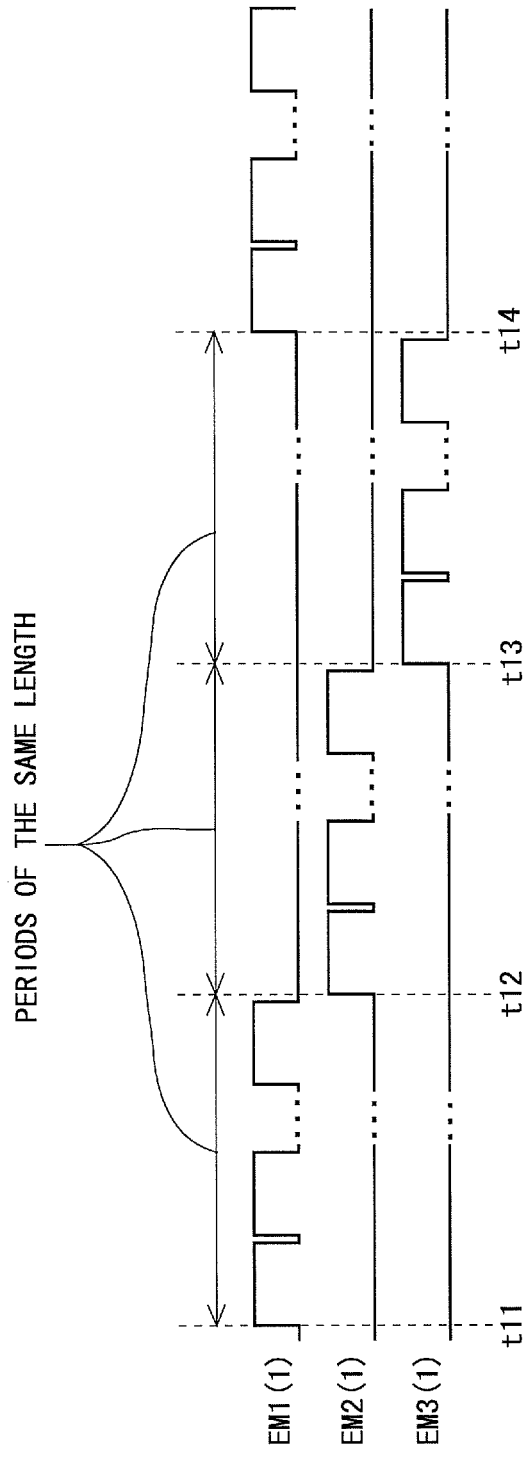
FIG. 26 is a diagram for describing drive of emission lines when in the low resolution mode in the first embodiment.

Meanwhile, if an emission line EM out of the first emission line EM1, the second emission line EM2, and the third emission line EM3, that is brought into the selected state when in the low resolution mode, is the same all the time, then bias in the levels of degradation of transistors and degradation of organic EL elements in each pixel circuit 40 may occur. Therefore, in the present embodiment, the configuration in which an emission line EM brought into the selected state when in the low resolution mode is changed periodically as shown in FIG. 26 is adopted. As understood from FIG. 26, the first emission line EM1 goes into the selected state from time t11 to time t12, the second emission line EM2 goes into the selected state from time t12 to time t13, and the third emission line EM3 goes into the selected state from time t13 to time t14.

In each frame period included in a period from time t11 to time t12 in FIG. 26, the scanning signal lines SL and the emission lines EM are driven as shown in FIG. 23. At this time, since only the first emission lines EM1 out of the first to third emission lines EM1 to EM3 go into the selected state, in each group, only the organic EL element OLED(R) goes into the light-emitting state in the pixel circuit 40(1), only the organic EL element OLED(G) goes into the light-emitting state in the pixel circuit 40(2), and only the organic EL element OLED(B) goes into the light-emitting state in the pixel circuit 40(3). Accordingly, when focusing on two groups (namely 18 subpixels) arranged next to each other in a direction in which the scanning signal lines SL extend, light-emitting states are as shown in FIG. 27 during a period from time t11 to time t12.

Figure 28:
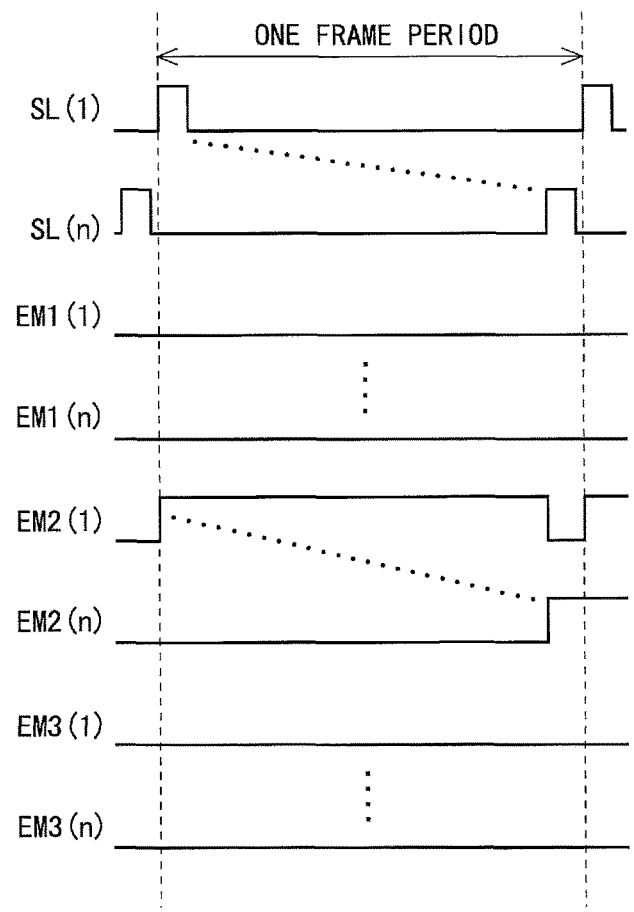
FIG. 28 is a diagram for describing drive of emission lines when in the low resolution mode in the first embodiment.
Figure 29:
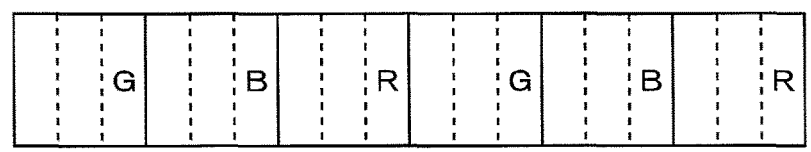
FIG. 29 is a diagram for describing light-emitting states of organic EL elements when in the low resolution mode in the first embodiment.

In each frame period included in a period from time t12 to time t13 in FIG. 26, the scanning signal lines SL and the emission lines EM are driven as shown in FIG. 28. At this time, since only the second emission lines EM2 out of the first to third emission lines EM1 to EM3 go into the selected state, in each group, only the organic EL element OLED(G) goes into the light-emitting state in the pixel circuit 40(1), only the organic EL element OLED(B) goes into the light-emitting state in the pixel circuit 40(2), and only the organic EL element OLED(R) goes into the light-emitting state in the pixel circuit 40(3). Accordingly, light-emitting states are as shown in FIG. 29 during a period from time t12 to time t13. In a same manner, in each frame period included in a period from time t13 to time t14 in FIG. 26, since only the third emission lines EM3 out of the first to third emission lines EM1 to EM3 go into the selected state, light-emitting states are as shown in FIG. 30.

Figure 27:
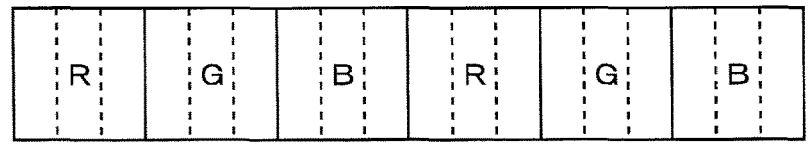
FIG. 27 is a diagram for describing light-emitting states of organic EL elements when in the low resolution mode in the first embodiment.
Figure 30:
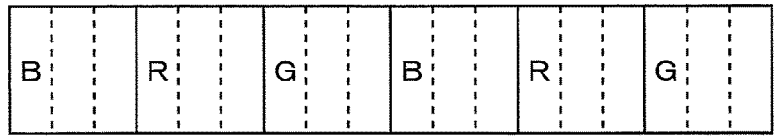
FIG. 30 is a diagram for describing light-emitting states of organic EL elements when in the low resolution mode in the first embodiment.

By the above, when in the low resolution mode, light-emitting states as shown in FIG. 27, light-emitting states as shown in FIG. 29, and light-emitting states as shown in FIG. 30 appear sequentially for a predetermined period. By this, the occurrence of bias in the levels of degradation of transistors and degradation of organic EL elements in the pixel circuit 40 is prevented.

<1.5 Effects>

According to the conventional configuration in which the time-division driving is performed, only organic EL elements for any one color in the entire display unit can be brought into a light-emitting state in one vertical scanning. Hence, in a case where the driving frequency is lowered, it is not possible to display a desired color image without giving uncomfortable feelings to eyes of viewers. Regarding this, in the present embodiment, one group is formed by three pixel circuits 40(1) to 40(3) each including a red-color organic EL element OLED(R), a green-color organic EL element OLED(G), and a blue-color organic EL element OLED(B). Then, the three pixel circuits 40(1) to 40(3) are configured such that organic EL elements OLED having respective light-emitting colors different from one another can be brought into a light-emitting state at the same time in the three pixel circuits 40(1) to 40(3) included in each group. Hence, a color image with a resolution equal to ⅓ of a resolution when in the time-division driving can be displayed by one vertical scanning. More specifically, a color image with a resolution equal to ⅓ of a resolution when in the time-division driving can be displayed at a driving frequency equal to ⅓ of a driving frequency when in the time-division driving. In this way, in the present embodiment, it is possible to display a low resolution image while lowering the driving frequency in an organic EL display device that adopts the time-division driving. Accordingly, by switching between image display in the high resolution mode and image display in the low resolution mode depending on, for example, the magnitude of demand regarding a definition of a display image, power consumption can be reduced compared to that in a case where image display is always performed by the time-division driving. Moreover, when in the low resolution mode, momentary luminances of the organic EL elements do not need to be increased compared to those in a case where the time-division driving is performed. Thus, shortening of the lifetime of the organic EL elements is suppressed.

Figure 31:
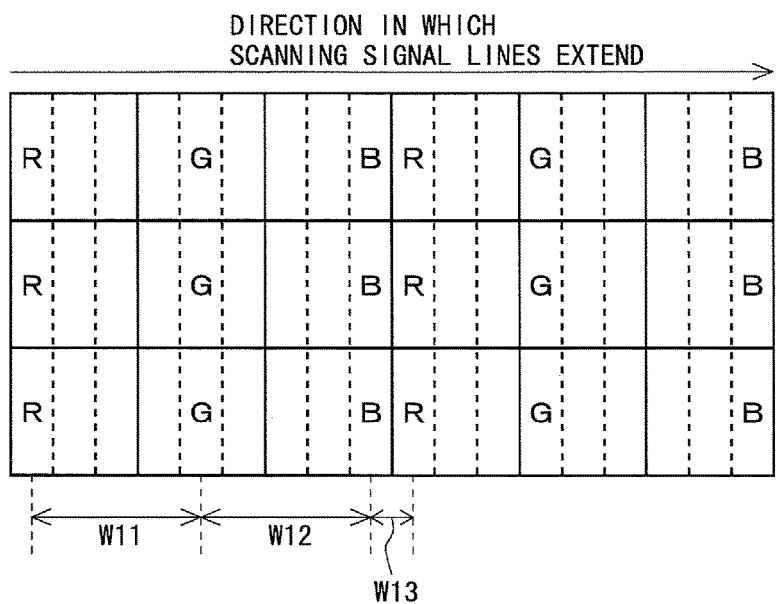
FIG. 31 is a schematic diagram showing light-emitting states in a case where a conventional configuration is adopted for an arrangement of pixels.
Figure 32:
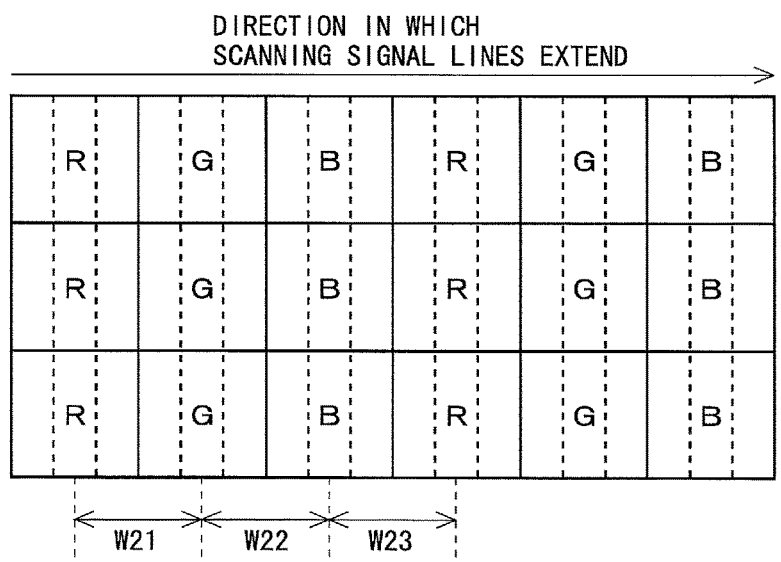
FIG. 32 is a schematic diagram showing light-emitting states in the first variant of the first embodiment.

Here, if an arrangement of pixels is an arrangement in a conventional configuration as shown in FIG. 9, light-emitting states are as shown in FIG. 31 when in the low resolution mode. In this case, when focusing on intervals (intervals regarding a direction in which the scanning signal lines SL extend) of subpixels corresponding to organic EL elements which go into a light-emitting state (hereinafter, referred to as "light-emitting subpixels"), as understood from FIG. 31, an interval W13 between B and R is narrower than an interval W11 between R and G, and is narrower than an interval W12 between G and B. Since the intervals of the light-emitting subpixels are not constant, display unevenness or vertical stripes (stripes of green and purple in an example shown in FIG. 31) may be recognized. In this regard, in the present embodiment, light-emitting states are as shown in FIG. 32 when in the low resolution mode. As understood from FIG. 32, an interval W21 between R and G, an interval W22 between G and B, and an interval W23 between B and R are equal. Namely, in the present embodiment, intervals of light-emitting subpixels regarding a direction in which the scanning signal lines SL extend are constant. Accordingly, occurrence of display unevenness (color unevenness) or vertical stripes is suppressed, and an image with which viewers do not feel uncomfortable is displayed.

By the above, in the present embodiment, it is possible to reduce power consumption over the conventional one while suppressing shortening of the lifetime of elements without causing a display defect in an organic EL display device that adopts the time-division driving.

Further, in the present embodiment, an emission line EM brought into the selected state when in the low resolution mode is changed periodically as shown in FIG. 26. Hence, in the pixel circuit 40, a transistor brought into the on state and an organic EL element brought into the light-emitting state are changed periodically. Accordingly, the occurrence of bias in the levels of degradation of transistors and degradation of organic EL elements in the pixel circuit 40 is prevented.

<1.6 Variants>
Variants of the above-described first embodiment will be described below.

<1.6.1 First Variant>
In the above-described first embodiment, the description is made on the presumption that one group is formed by three pixel circuits 40 arranged side by side in the extension direction of the scanning signal lines SL, and that one pixel is formed by three pixel circuits 40 included in each group when in the low resolution mode. However, the present invention is not limited thereto. One pixel may be formed by k×3 pixel circuits 40 corresponding to k consecutive rows in an extension direction of the data lines DL when in the low resolution mode. This will be described below.

Figure 33:
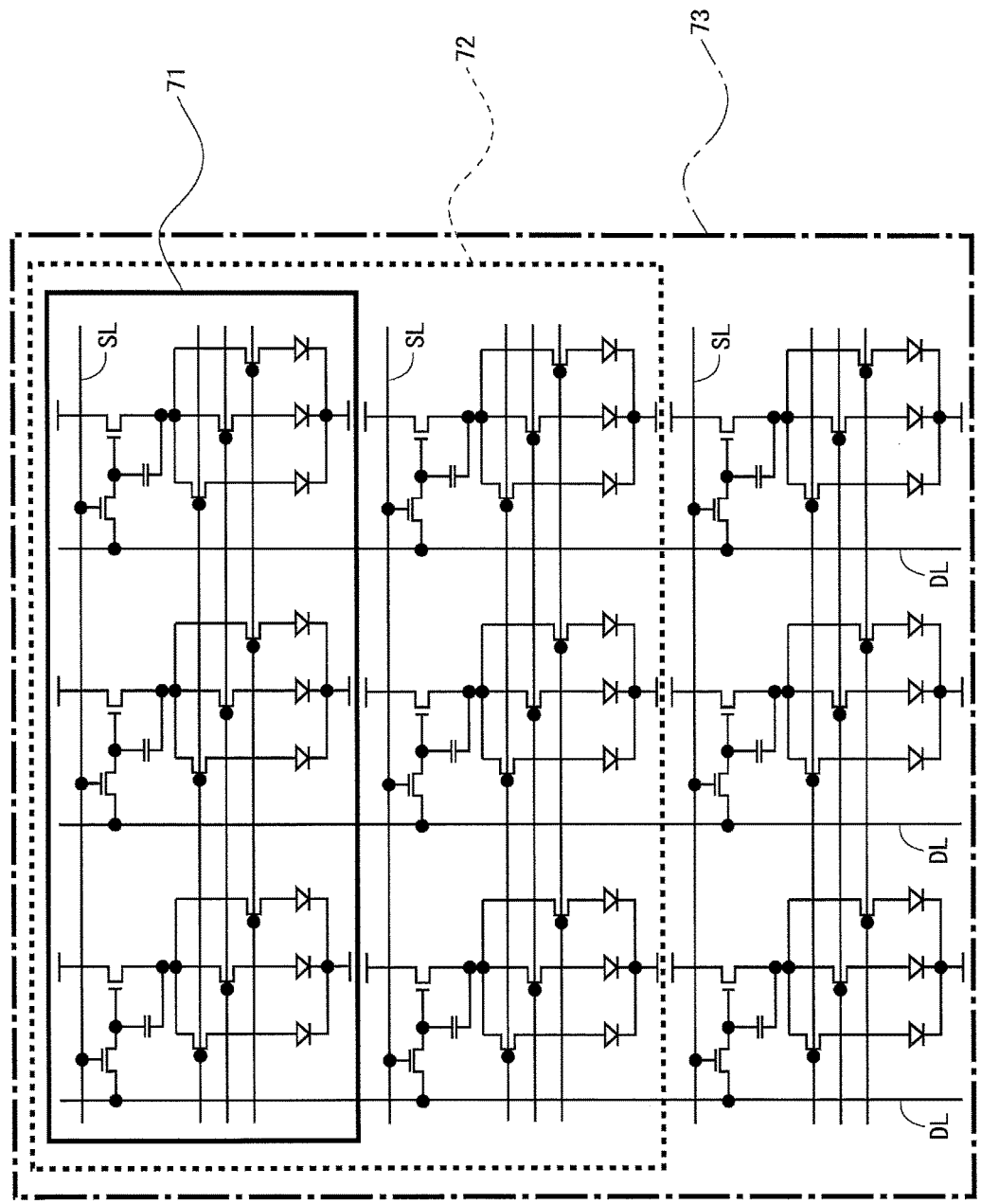
FIG. 33 is a diagram for describing how to form one pixel when in the low resolution mode in the first variant of the first embodiment.
Figure 34:
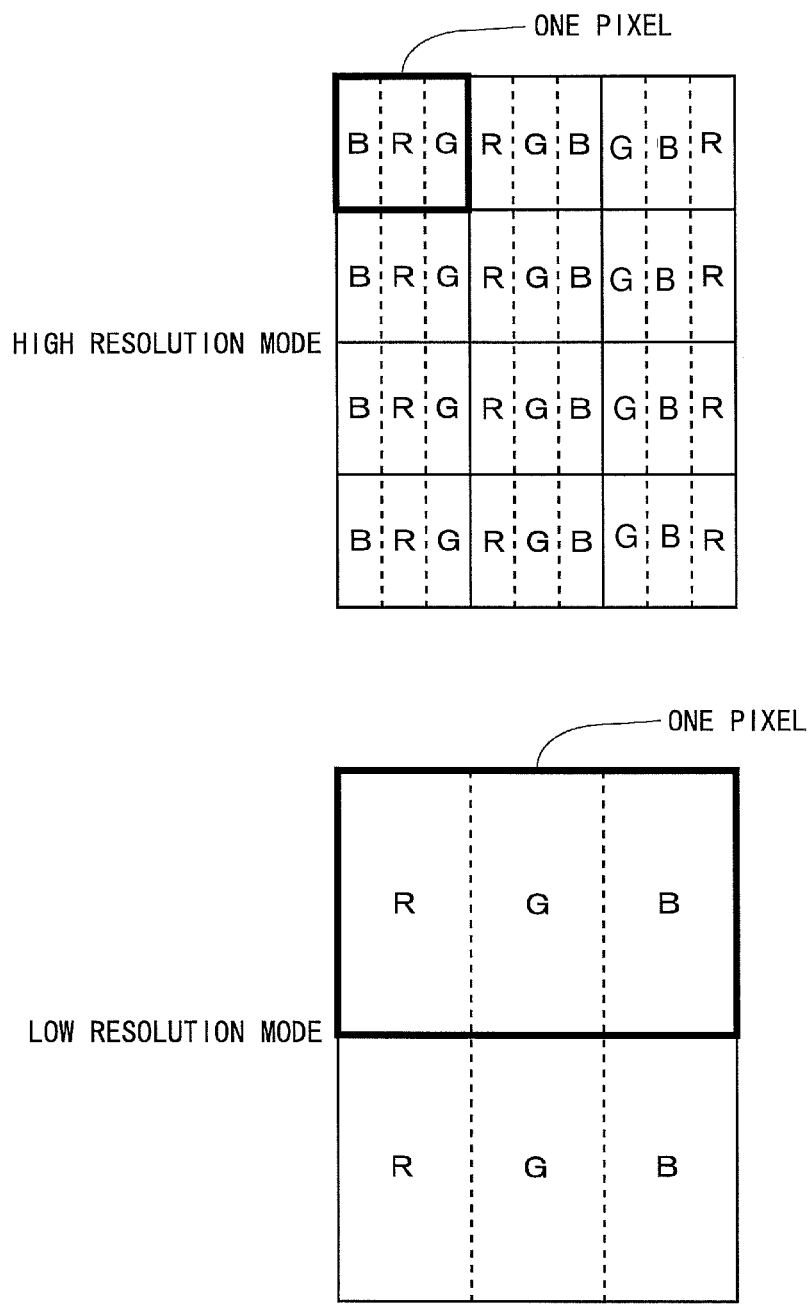
FIG. 34 is a diagram for describing the case of forming one pixel by six pixel circuits included in two consecutive rows in an extension direction of data lines in the first variant of the first embodiment.
Figure 35:
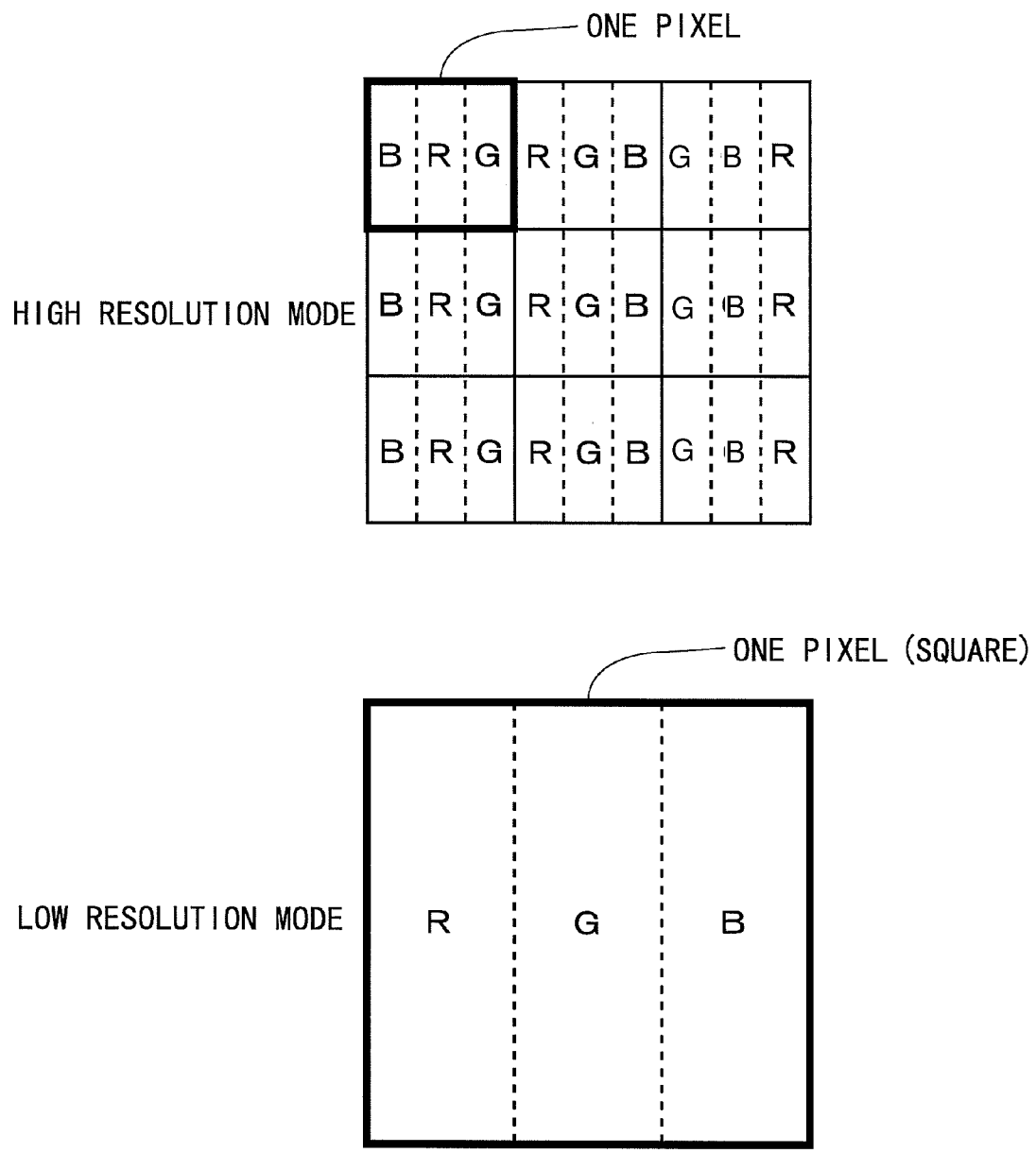
FIG. 35 is a diagram for describing the case of forming one pixel by nine pixel circuits included in three consecutive rows in an extension direction of data lines in the first variant of the first embodiment.

In the above-described first embodiment, one pixel in the low resolution mode is formed by three pixel circuits 40 in one row, as indicated by reference character 71 in FIG. 33. However, one pixel in the low resolution mode may be formed as shown below. For example, as indicated by reference character 72 in FIG. 33, one pixel may be formed by six pixel circuits 40 included in two consecutive rows in the extension direction of the data lines DL. In this case, as shown in FIG. 34, one pixel in the low resolution mode corresponds to six pixels in the high resolution mode. By this, when in the low resolution mode, an image with a ⅙ resolution of an image displayed when in the high resolution mode is displayed on the display unit 500. In addition, for example, as indicated by reference character 73 in FIG. 33, one pixel may be formed by nine pixel circuits 40 included in three consecutive rows in the extension direction of the data lines DL. In this case, as shown in FIG. 35, one pixel in the low resolution mode corresponds to nine pixels in the high resolution mode. By this, when in the low resolution mode, an image with a ⅑ resolution of an image displayed when in the high resolution mode is displayed on the display unit 500. Note that in the example shown in FIG. 35, when one pixel is formed by nine pixel circuits 40 included in three rows, the shape of the pixel is a square. By thus configuring the shape of the pixel when in the low resolution mode to be a square, a more natural image is displayed on the display unit 500 when in the low resolution mode.

Figure 36:
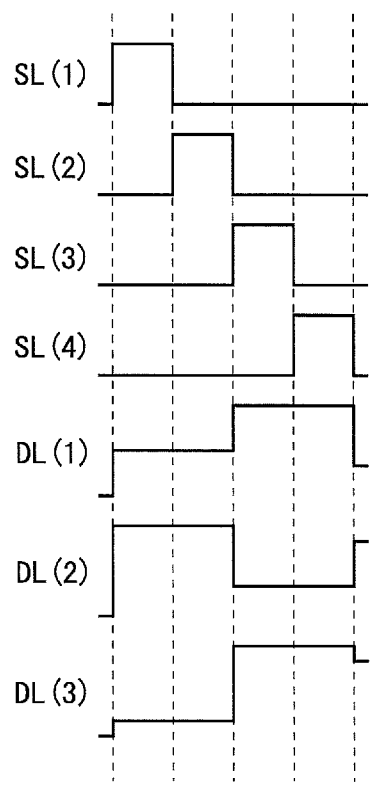
FIG. 36 is a timing chart for describing a method for driving the data lines in the first variant of the first embodiment.

Meanwhile, when one pixel is formed by k×3 pixel circuits corresponding to k consecutive rows in the extension direction of the data lines DL, the source driver 200 does not need to change a data voltage applied to each data line DL, during a period during which k scanning signal lines SL are sequentially brought into the selected state, in each frame period when in the low resolution mode. For example, when one pixel is formed by six pixel circuits 40 included in two consecutive rows in the extension direction of the data lines DL, the source driver 200 has only to change, as shown in FIG. 36, the magnitude of a data voltage applied to each data line DL every time two scanning signal lines SL are selected. By this, the power consumption of the source driver 200 for when the display mode is the low resolution mode can be reduced.

<1.6.2 Second Variant>
Although three organic EL elements OLED(R), OLED(G), and OLED(B) are included in each pixel circuit 40 (that is, one pixel in the high resolution mode is formed by three subpixels), the present invention is not limited thereto. Four or more organic EL elements for performing light emission for different colors may be included in each pixel circuit 40. Here, an example in which four organic EL elements are included in each pixel circuit 40 will be described.

Figure 37:
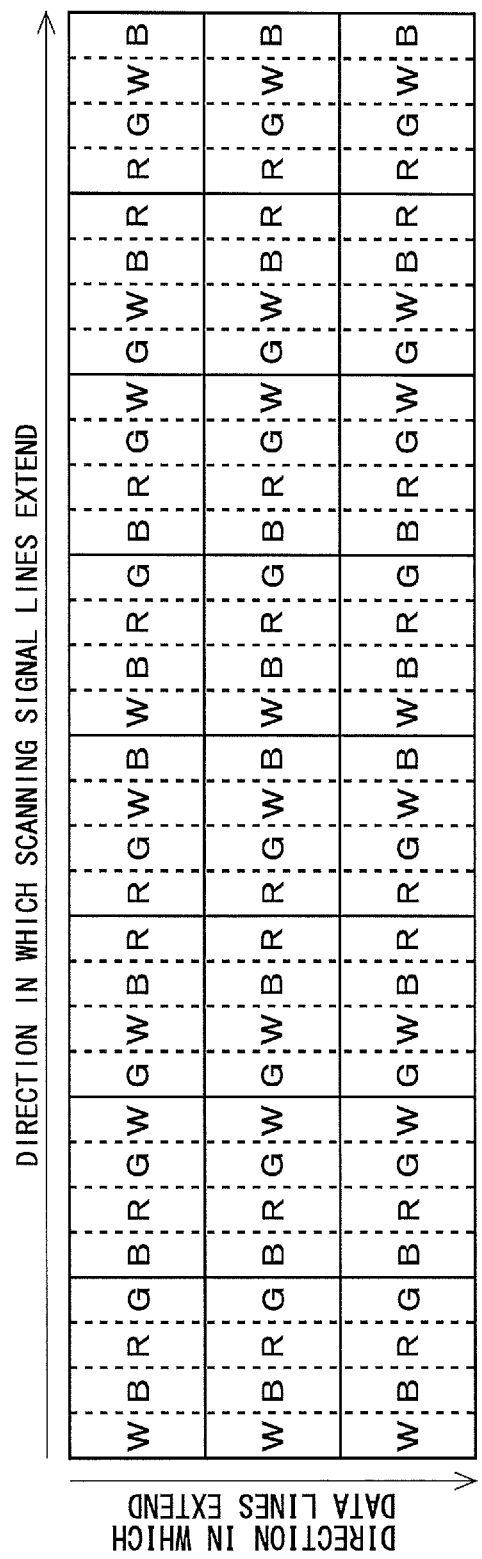
FIG. 37 is a schematic diagram showing an arrangement of pixels in the second variant of the first embodiment.

FIG. 37 is a schematic diagram showing an arrangement of pixels in the present variant. As shown in FIG. 37, in the present variant, subpixels aligned in the order of "W subpixel, B subpixel, R subpixel, G subpixel, B subpixel, R subpixel, G subpixel, W subpixel, G subpixel, W subpixel, B subpixel, R subpixel, R subpixel, G subpixel, W subpixel, and B subpixel" are repeatedly provided in an extension direction of the scanning signal lines SL. Note that W subpixel is a subpixel for displaying white. Regarding an extension direction of the data lines DL, as in the above-described first embodiment, subpixels for the same color are repeatedly provided. In the above-described configuration, four pixels (16 subpixels) arranged in a direction in which the scanning signal lines SL extend are defined as one group. That is, four pixel circuits 40 are defined as one group. Then, when the display mode is the low resolution mode, one pixel is formed by four pixel circuits 40 included in each group, and when the display mode is the high resolution mode, one pixel is formed by one pixel circuit 40.

Figure 38:
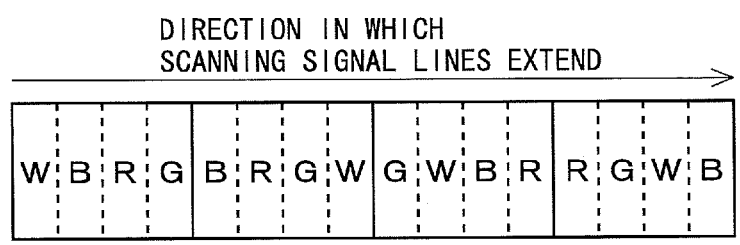
FIG. 38 is a schematic diagram showing a configuration of subpixel group forming one group in the second variant of the first embodiment.
Figure 39:
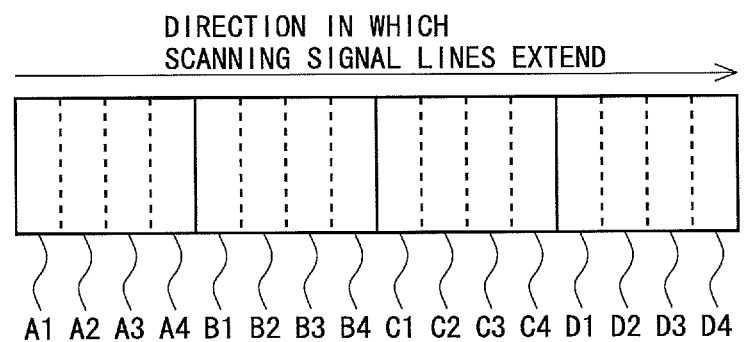
FIG. 39 is a diagram for describing a configuration of subpixel group forming one group in the second variant of the first embodiment.

In the present variant, a configuration of subpixel group forming one group is as shown in FIG. 38. However, it is not limited to the configuration shown in FIG. 38. The configuration may be such that, when each of subpixels forming one group is denoted by reference character as shown in FIG. 39, subpixels A1, B1, C1, and D1 correspond to subpixels for different colors, subpixels A2, B2, C2, and D2 correspond to subpixels for different colors, subpixels A3, B3, C3, and D3 correspond to subpixels for different colors, and subpixels A4, B4, C4, and D4 correspond to subpixels for different colors. Note that it is assumed that each of "subpixels A1 to A4", "subpixels B1 to B4", "subpixels C1 to C4", and "subpixels D1 to D4" constitutes subpixels of four colors.

Note that, in the present variant, since four organic EL elements OLED are included in each pixel circuit 40, first to fourth emission lines EM1 to EM4 are disposed in the display unit 500, as emission lines EM. Further, in response to this, first to fourth emission drivers are provided as emission drivers.

Figure 40:
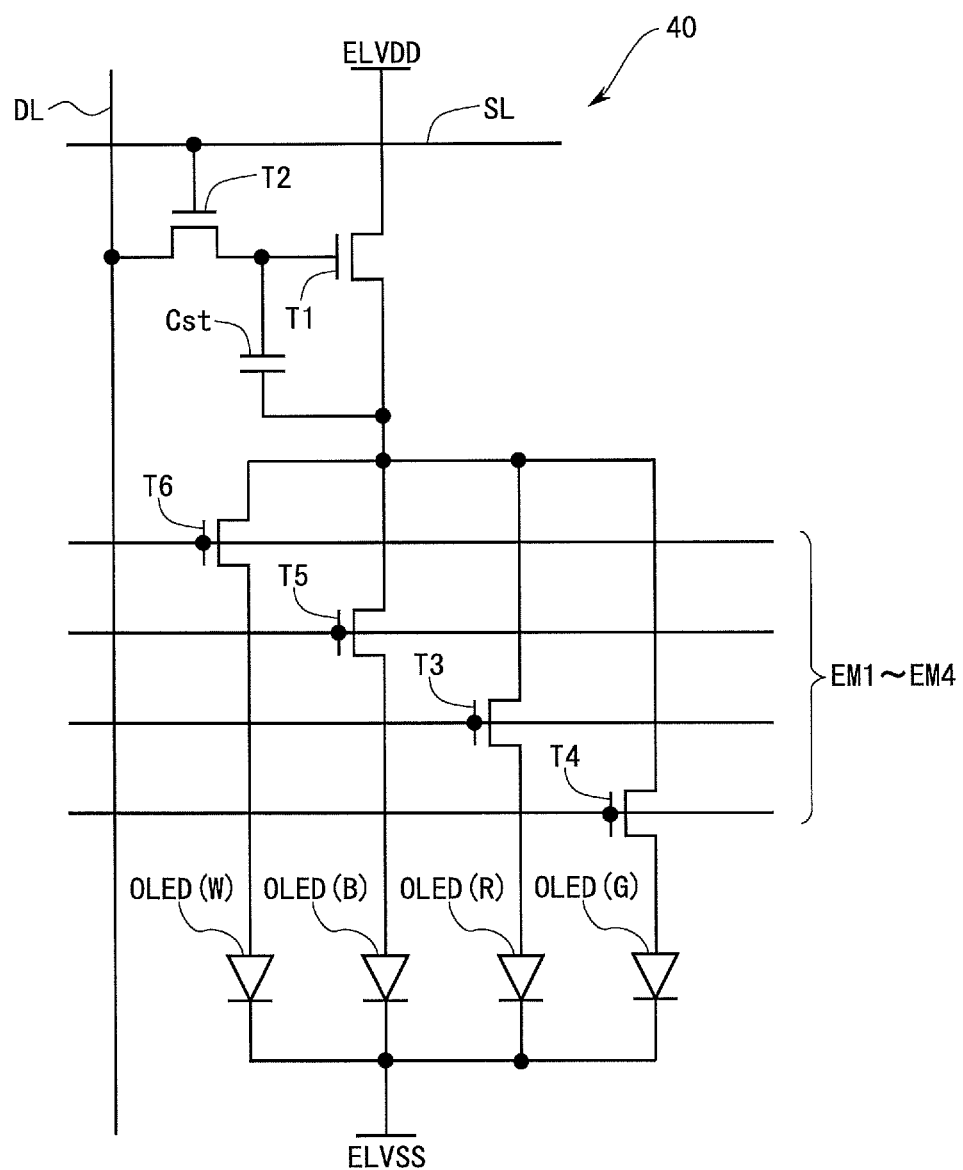
FIG. 40 is a circuit diagram showing a configuration of one pixel in the second variant of the first embodiment.
Figure 41:
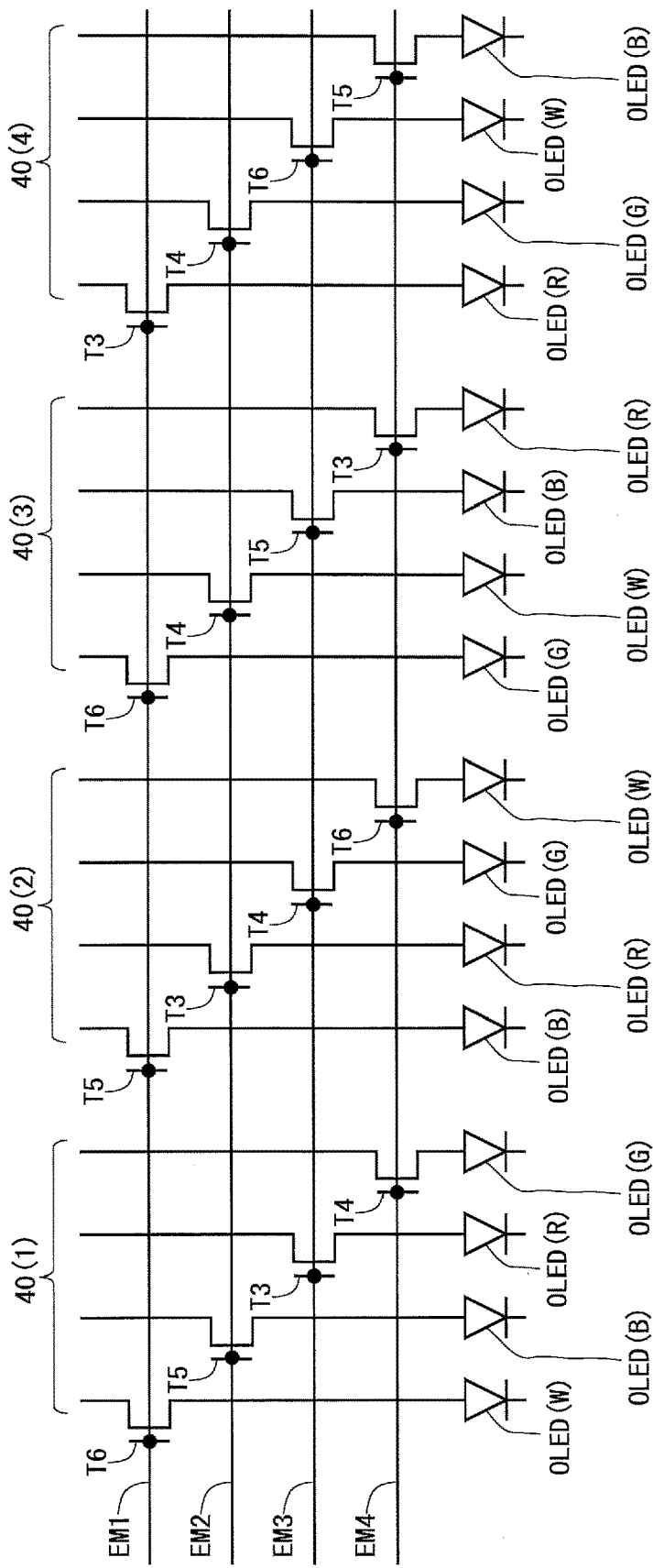
FIG. 41 is a diagram for describing a connection relationship between the gate terminals of transistors included in four pixel circuits included in one group and first to fourth emission lines in the second variant of the first embodiment.

FIG. 40 is a circuit diagram showing a configuration of one pixel in the present variant. FIG. 41 is a diagram for describing a connection relationship between the gate terminals of transistors T3 to T6 included in four pixel circuits 40(1) to 40(4) included in one group and first to fourth emission lines EM1 to EM4 in the present variant. Note that FIG. 40 shows a configuration of the pixel circuit 40(1) in FIG. 41. Each pixel circuit 40 includes four organic EL elements OLED(R), OLED(G), OLED(B), and OLED(W). The organic EL element OLED(W) functions as an electro-optical element that emits white light. Further, each pixel circuit 40 is provided with transistor T6 as a light-emission control transistor that perform light emission control by controlling the supply of a drive current to the organic EL elements OLED(W), in addition to transistors T3 to T5.

When focusing on each pixel circuit 40, gate terminals of the transistors T3 to T6 are connected to different emission lines EM. Further, when focusing on four pixel circuits 40(1) to 40(4) and the first to fourth emission lines EM1 to EM4, each emission line EM is connected to gate terminals of light-emission control transistors corresponding to organic EL elements OLED having respective light-emitting colors different from one another in the four pixel circuits 40(1) to 40(4).

By switching between image display in the high resolution mode and image display in the low resolution mode depending on, for example, the magnitude of demand regarding a definition of a display image as in the above-described first embodiment in the above-described configuration, also in an organic EL display device in which each pixel circuit 40 includes four organic EL elements OLED (R), OLED(G), OLED(B), and OLED(W), it is possible to reduce power consumption over the conventional one while suppressing shortening of the lifetime of elements without causing a display defect.

Note that, when in the low resolution mode, one pixel may be formed by k×4 pixel circuits 40 corresponding to k consecutive rows in an extension direction of the data lines DL, as in the above-described first variant. In further generalization, one pixel may be formed by k×j pixel circuits 40 (j is an integer greater than or equal to three) which are included in k groups corresponding to k consecutive rows (k is an integer greater than or equal to two). In this case, an image with a resolution equal to 1/(k×j) of a resolution of an image displayed on the display unit 500 when the display mode is the high resolution mode is displayed on the display unit 500.

Further, the configuration of subpixel group forming one group can be generalized as follows. When focusing on a p-th organic EL element OLED(p is any integer between one and j, inclusive) regarding a direction in which the scanning signal lines SL extend in each of the j pixel circuits 40 (j is an integer greater than or equal to three) included in each group, the subpixel group may be configured such that j organic EL elements OLED focused in each group are organic EL elements OLED each having an individual light-emitting color. Note that it is assumed that j organic EL elements OLED having respective light-emitting colors different from one another are included in each pixel circuit 40.

<1.6.3 Third Variant>

In the above-described first embodiment, in order to prevent the occurrence of bias in the levels of degradation of transistors and degradation of organic EL elements in each pixel circuit 40, an emission line EM brought into the selected state when in the low resolution mode is changed periodically. However, the present invention is not limited thereto. For example, an emission line EM brought into the selected state when in the low resolution mode may be changed every time the display mode is switched from the high resolution mode to the low resolution mode. Further, for example, an emission line EM brought into the selected state when in the low resolution mode may be changed every time the power of the device is turned on.

2. Second Embodiment

<2.1 Summary>

A second embodiment of the present invention will be described. In recent years, in order to realize a reduction in power consumption in a display device, developments have been made in a driving method involving "providing a pause period during which a write operation of image data pauses by bringing all scanning signal lines into a non-scanning state, between a refresh period (a writing period) and a refresh period (a writing period)". Such a driving is called, for example, "pause driving". In a display device adopting the pause driving, since it can bring the operation of the peripheral drivers to a halt in the pause period, power consumption can be reduced. Also in the organic EL display device, the pause driving like this is being adopted. Therefore, an organic EL display device adopting the pause driving will be described as a second embodiment of the present invention. Note that an overall configuration (see FIG. 2), an arrangement of pixels (see FIG. 1), a configuration of pixel circuits (see FIG. 13) and so on are the same as those of the first embodiment, and thus, description thereof is omitted.

<2.2 Driving Method>

Figure 42:
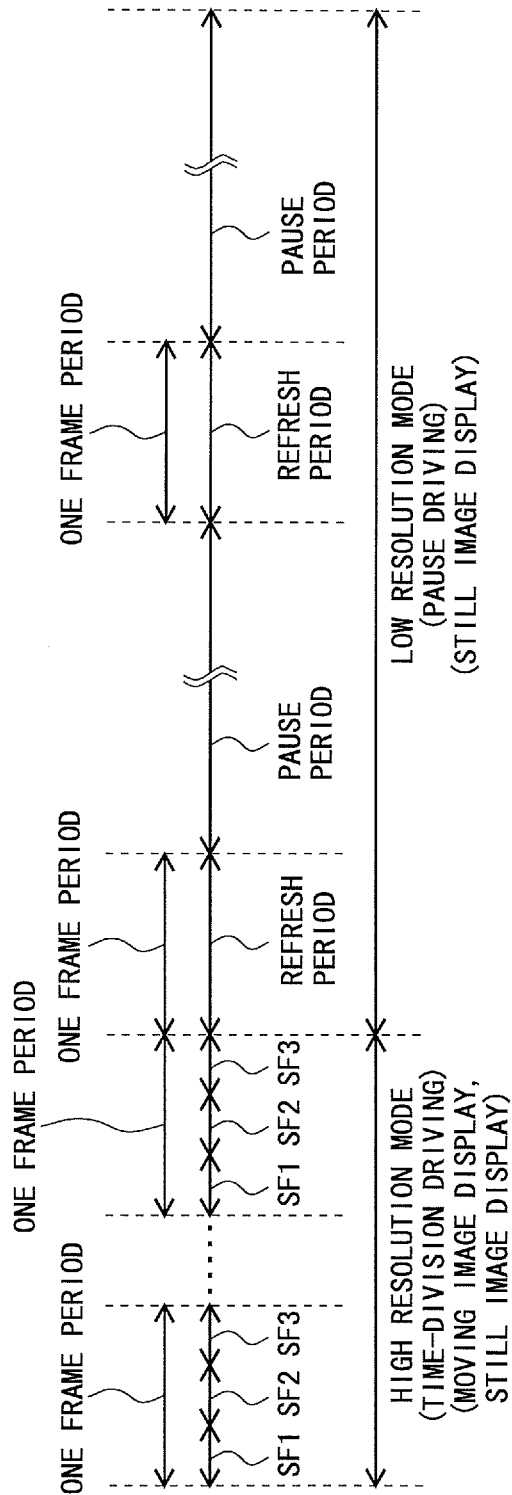
FIG. 42 is a diagram for describing a summary of a driving method in the second embodiment.
Figure 48:
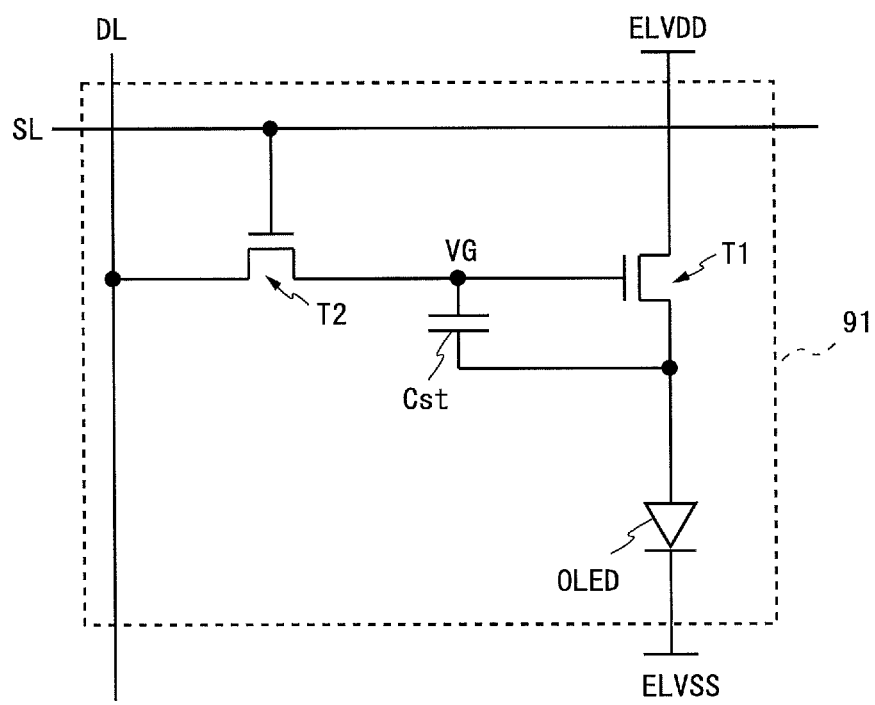
FIG. 48 is a circuit diagram showing a configuration of a conventional general pixel circuit forming one subpixel.
Figure 49:
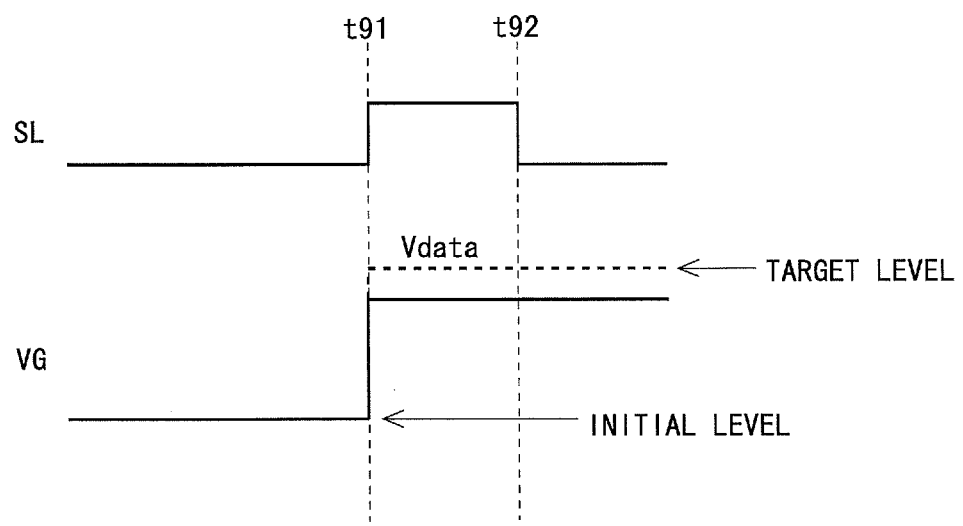
FIG. 49 is a timing chart for describing an operation of the pixel circuit shown in FIG. 48.
Figure 50:
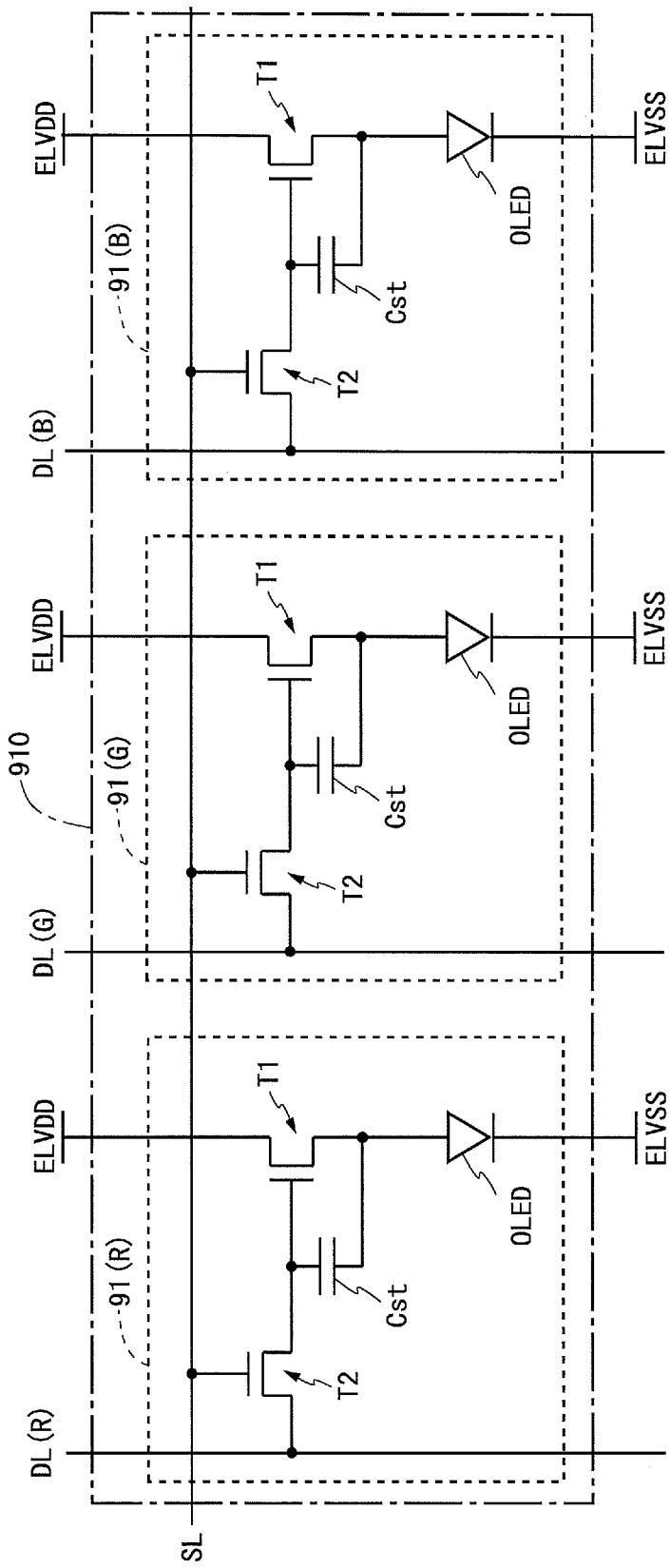
FIG. 50 is a circuit diagram showing a configuration of a pixel circuit corresponding to one pixel in a conventional example.
Figure 51:
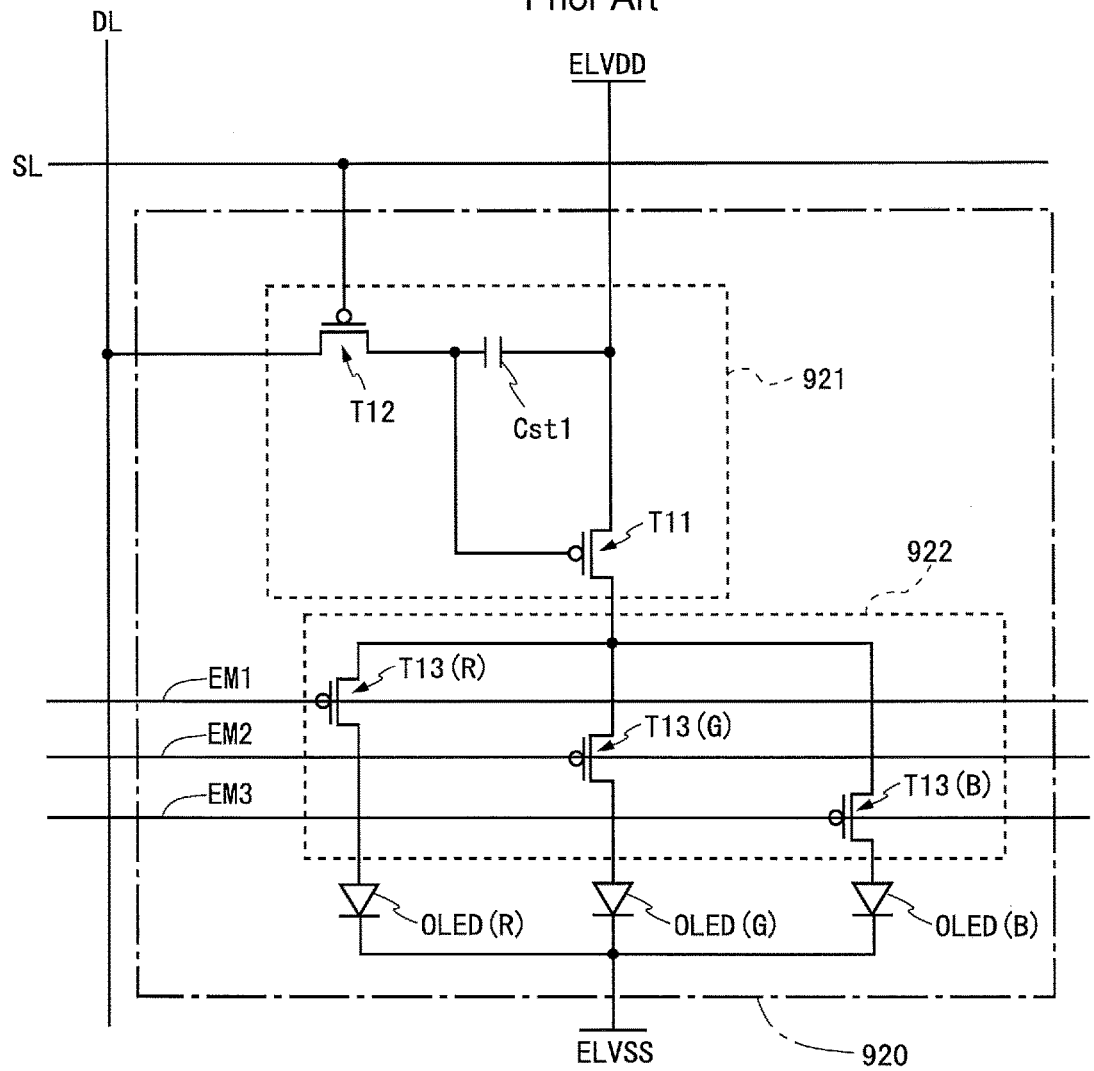
FIG. 51 is a circuit diagram showing a configuration of a pixel circuit corresponding to one pixel in an example disclosed in Japanese Patent Application Laid-Open No. 2005-148749.
Figure 52:
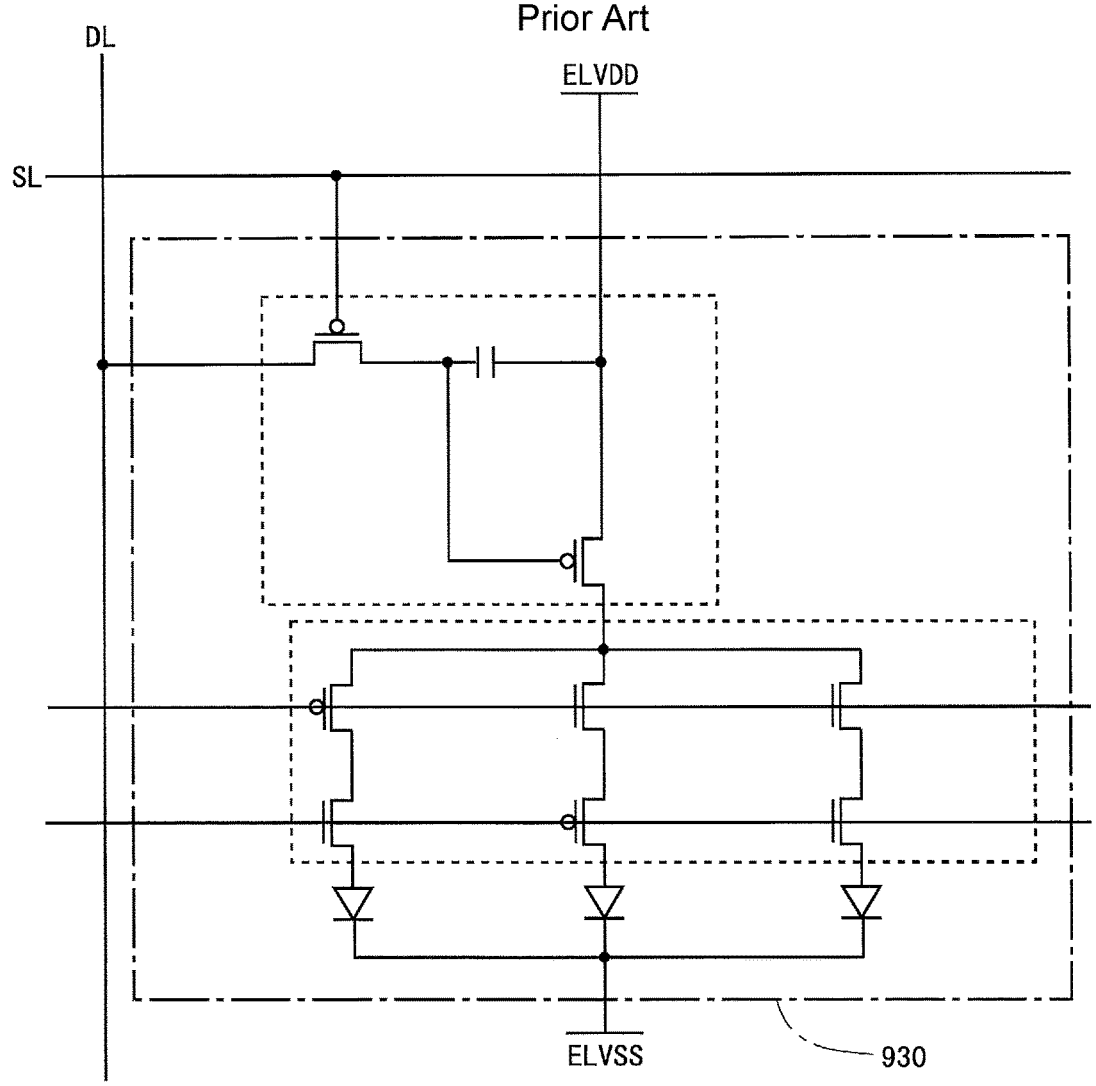
FIG. 52 is a circuit diagram showing a configuration of a pixel circuit corresponding to one pixel in an example disclosed in Japanese Patent Application Laid-Open No. 2005-148750.

FIG. 42 is a diagram for describing a summary of a driving method in the present embodiment. Also in the organic EL display device 1 according to the present embodiment, switching the display mode between the high resolution mode and the low resolution mode is performed. In the present embodiment, although the time-division driving is performed as in the above-described first embodiment when the display mode is the high resolution mode, the above-described pause driving is performed when the display mode is the low resolution mode.

The display mode at normal times is set to the high resolution mode. When in the high resolution mode, moving image display or still image display is performed by performing the time-division driving that divides one frame period into three sub-frames SF1 to SF3. In a case where there is no change in image content throughout a period longer than or equal to a given period when operation is performed by the time-division driving, the display mode is switched from the high resolution mode to the low resolution mode (namely, switching from the time-division driving to the pause driving is performed).

When in the low resolution mode, a refresh period during which writing of image data to the pixel circuits 40 is performed and a pause period during which the writing of image data to the pixel circuits 40 is brought into a pause state are repeated. For example, a refresh period having a length corresponding to one frame period (one frame period: 16.67 ms) in a general display device having a refresh rate (a drive frequency) of 60 Hz and a pause period having a length corresponding to a 59-frame period appear alternately. In this manner, when in the low resolution mode, still image display on the display unit 500 is performed at a refresh rate lower than that in the high resolution mode (time-division driving), based on the writing of image data performed during a refresh period.

FIG. 43 is a timing chart showing the waveforms of scanning signals and light-emission control signals for when the display mode is a low resolution mode in the present embodiment. Note that operation performed when the display mode is the low resolution mode is the same as that of the first embodiment, and thus, description thereof is omitted. As shown in FIG. 43, when in the low resolution mode, the refresh period and the pause period are repeated.

When a refresh period starts, first, the emission driver brings all of the emission lines EM corresponding to the first row into the non-selected state. By this, all of the organic EL elements OLED included in the pixel circuit 40 in the first row are brought into the light-off state. Thereafter, as for the first row, the emission driver brings the first emission line EM1(1) into the selected state and keeps the second emission line EM2(1) and the third emission line EM3(1) in the non-selected state. In addition, the gate driver 300 brings the scanning signal line SL(1) into the selected state. Accordingly, in each pixel circuit 40 in the first row, the capacitor Cst is charged based on a data voltage applied to the data line DL. When the gate driver 300 brings the scanning signal line SL(1) into the non-selected state, in each pixel circuit 40 in the first row, the transistor T2 goes into an off state. Then, in each pixel circuit 40 in the first row, a drive current depending on the magnitude of the gate-source voltage Vgs flows between the drain and source of the transistor T1. As a result, as in the above-described first embodiment, the organic EL element OLED(R) emits light in the pixel circuit 40(1), the organic EL element OLED(G) emits light in the pixel circuit 40(2), and the organic EL element OLED(B) emits light in the pixel circuit 40(3). Thereafter, the emission driver keeps the first emission line EM1(1) in the selected state. Operation such as that described above is sequentially performed for the second to nth rows. By this, an image is displayed on the display unit 500.

During the pause period, the emission driver keeps all of the first emission lines EM1(1) to EM1(*n*) in the selected state, and keeps all of the second emission lines EM2(1) to EM2(*n*) and all of the third emission lines EM3(1) to EM3(*n*) in the non-selected state. By this, the transistor T3 is maintained in the on state in the pixel circuit 40(1), the transistor T4 is maintained in the on state in the pixel circuit 40(2), and the transistor T5 is maintained in the on state in the pixel circuit 40(3). Hence, the organic EL elements OLED in each pixel circuit 40 keep the same light-emitting states as those for the refresh period. Specifically, as with the refresh period, the organic EL element OLED(R) emits light in the pixel circuit 40(1), the organic EL element OLED(G) emits light in the pixel circuit 40(2), and the organic EL element OLED(B) emits light in the pixel circuit 40(3). By the above, an image displayed in the refresh period is continuously displayed in the pause period as well.

By the above, the transitions of the light-emitting states of the organic EL elements OLED in three pixel circuits 40(1) to 40(3) included in one group are as follows (see FIG. 44). In the pixel circuit 40(1), after the organic EL elements OLED for all colors are temporarily brought into the light-off state, only the red-color organic EL element OLED(R) is brought into the light-emitting state during the refresh period and the pause period. In the pixel circuit 40(2), after the organic EL elements OLED for all colors are temporarily brought into the light-off state, only the green-color organic EL element OLED(G) is brought into the light-emitting state during the refresh period and the pause period. In the pixel circuit 40(3), after the organic EL elements OLED for all colors are temporarily brought into the light-off state, only the blue-color organic EL element OLED(B) is brought into the light-emitting state during the refresh period and the pause period. The above-described state is repeated during a period during which the display mode is the low resolution mode. That is, when the display mode is the low resolution mode, unlike when the display mode is the high resolution mode, the organic EL elements OLED for multiple colors do not sequentially emit light in each pixel circuit 40. By the above, on the display unit 500 is displayed an image in a state in which one pixel is formed by three pixel circuits 40(1) to 40(3) included in one group, namely an image in a state in which one pixel is formed by nine subpixels (note that only three subpixels are brought into the light-emitting state).

Meanwhile, during the pause period, all of the scanning signal lines SL(1) to SL(n) are maintained in the non-selected state. Further, during the pause period, data voltages are not applied to the data lines DL from the source driver 200. That is, during the pause period, the gate driver 300 and the source driver 200 go into a pause state. Hence, the power consumption of the gate driver 300 and the source driver 200 during the pause period is zero.

Note that although only the first emission lines EM1 are brought into the selected state during the refresh period and the pause period in the above-described example, the present invention is not limited thereto. Only the second emission lines EM2 may be brought into the selected state during the refresh period and the pause period, or only the third emission lines EM3 may be brought into the selected state during the refresh period and the pause period. Further, by adopting a configuration in which an emission line EM brought into the selected state is changed periodically, it is possible to prevent the occurrence of bias in the levels of degradation of transistors and degradation of organic EL elements in the pixel circuit 40.

<2.3 Effects>

According to the present invention, as in the above-described first embodiment, it is possible to reduce power consumption over the conventional one while suppressing shortening of the lifetime of elements without causing a display defect in an organic EL display device that adopts the time-division driving. Here, in the present embodiment, the pause driving is performed when in the low resolution mode, an extremely remarkable effect is obtained in regard to reducing power consumption. This will be described below.

When the pause driving mode is performed, the states of the components during a refresh period and a pause period are as shown in FIG. 45. As can be grasped from FIG. 45, during the refresh period, the operation of the source driver 200, the scanning operation of the gate driver 300 (the operation of sequentially bringing the scanning signal lines SL into the selected state one by one), and the scanning operation of the emission driver (the operation of sequentially bringing the emission lines EM into the selected state one by one) are in an on state. Note, however, that the driving frequency in the refresh period is one-third of that during the time-division driving. Further, during the pause period, the operation of the source driver 200, the scanning operation of the gate driver 300, and the scanning operation of the emission driver are in an off state. By the above, as shown in FIG. 46, if the magnitude of the power consumption of the peripheral drivers during the time-division driving is "9" (the unit is any unit), then the magnitude of the power consumption of the peripheral drivers in the refresh period during the pause driving is "3", and the magnitude of the power consumption of the peripheral drivers in the pause period during the pause driving is substantially "0". FIG. 47 is a diagram showing the driving frequency and power consumption of the peripheral drivers during the time-division driving, and the driving frequency and power consumption of the peripheral drivers in the pause period during the pause driving. Although the power consumption is three times higher during the time-division driving compared to the case of adopting the general driving, it can be grasped from FIG. 47 that the power consumption of the peripheral drivers can be significantly reduced by adopting the pause driving. Note that, as for the first emission driver 401, it keeps all of the first emission lines EM1(1) to EM1(*n*) in the selected state and thus only direct-current power is consumed, during the refresh period and the pause period. As described above, according to the present embodiment, in the organic EL display device adopting the time-division driving, power consumption can be greatly reduced over the conventional one.

In addition, as described below, by adopting oxide TFTs (thin-film transistors using an oxide semiconductor for a channel layer) such as In—Ga—Zn—O-TFTs for the transistors in the pixel circuits 40, too, an extremely remarkable effect is obtained in regard to reducing power consumption. The off-leakage current (current flowing through when in an off state) in the oxide TFTs is very small compared to that in the thin-film transistors using low-temperature polysilicon, amorphous silicon, or the like, for a channel layer. For example, the off-leakage current in an In—Ga—Zn—O-TFT is 1/1000 or less of that in an LTPS-TFT (thin-film transistor using low-temperature polysilicon for a channel layer). Hence, according to the present embodiment in which oxide TFTs such as In—Ga—Zn—O-TFTs are adopted, the gate-source voltage Vgs of the drive transistor (the transistor T1 in FIG. 13 and so on) can be held for a longer period of time than the conventional one. Accordingly, by increasing the length of the pause period when in the pause driving to reduce the refresh rate, power consumption can be significantly reduced over the conventional one.

<2.4 Variants>

Also regarding the present embodiment, as in the first variant of the above-described first embodiment, one pixel may be formed by k×3 pixel circuits 40 corresponding to k consecutive rows in an extension direction of the data lines DL when in the low resolution mode. Further, as in the second variant of the above-described first embodiment, four or more organic EL elements OLED for performing light emission for different colors may be included in each pixel circuit 40.

<3. Others>

The present invention is not limited to the above-described embodiments and variants, and may be implemented by making various modifications thereto without departing from the true scope and spirit of the present invention. For example, although description is made using, as an example, an organic EL display device in the above-described embodiments and variants, the present invention can also be applied to display devices other than organic EL display devices as long as the display devices include self light-emitting type display elements which are driven by a current.

Further, although n-channel transistors are used as transistors in pixel circuits 40 in the above-described embodiments and variants, p-channel transistors may be used.

DESCRIPTION OF REFERENCE CHARACTERS

1: ORGANIC EL DISPLAY DEVICE
7: ORGANIC EL PANEL
40 and 40(1) to 40(3): PIXEL CIRCUIT
45: DRIVE CURRENT CONTROL UNIT
100: DISPLAY CONTROL CIRCUIT
110: DISPLAY MODE SWITCHING CONTROL CIRCUIT
120: RESOLUTION SWITCHING CONTROL CIRCUIT
130: SOURCE CONTROL CIRCUIT
140: GATE CONTROL CIRCUIT
200: SOURCE DRIVER
300: GATE DRIVER
401 to 403: FIRST TO THIRD EMISSION DRIVERS
500: DISPLAY UNIT
T1: DRIVE TRANSISTOR
T2: INPUT TRANSISTOR
T3 to T6: LIGHT-EMISSION CONTROL TRANSISTOR
Cst: CAPACITOR
OLED(R): RED-COLOR ORGANIC EL ELEMENT (ELECTRO-OPTICAL ELEMENT)
OLED(G): GREEN-COLOR ORGANIC EL ELEMENT (ELECTRO-OPTICAL ELEMENT)
OLED(B): BLUE-COLOR ORGANIC EL ELEMENT (ELECTRO-OPTICAL ELEMENT)
DL and DL(1) to DL(m): DATA LINE
SL and SL(1) to SL(n): SCANNING SIGNAL LINE
EM: EMISSION LINE
EM1 and EM1(1) to EM1($n$): FIRST EMISSION LINE
EM2 and EM2(1) to EM2($n$): SECOND EMISSION LINE
EM3 and EM3(1) to EM3($n$): THIRD EMISSION LINE
ELVDD: HIGH-LEVEL POWER SUPPLY VOLTAGE AND HIGH-LEVEL POWER SUPPLY LINE
ELVSS: LOW-LEVEL POWER SUPPLY VOLTAGE AND LOW-LEVEL POWER SUPPLY LINE

The invention claimed is:

1. A display device comprising:
a display that includes:
pixel circuits arranged in a matrix so as to define rows and columns;
scanning signal lines provided in a one-to-one correspondence with the rows; and
data lines provided in a one-to-one correspondence with the columns, wherein
a display mode is switchable between a low resolution mode and a high resolution mode,
each of the pixel circuits includes j electro-optical elements, where j is an integer greater than or equal to two, each of the electro-optical elements having an individual different light-emitting color,
the pixel circuits are configured such that, in the low resolution mode, intervals of the electro-optical elements which go into a light-emitting state have an equal distance between each other in a direction in which the scanning signal lines extend in each frame, the frame being a period in which an image for one screen is displayed,
the intervals of the electro-optical elements which go into the light-emitting state in the low resolution mode have a larger distance between each other than the intervals of the electro-optical elements which go into the light-emitting state in the high resolution mode,
when the display mode is the high resolution mode, an image is displayed on the display by dividing the frame into j sub-frames and bringing an electro-optical element having a different light-emitting color into the light-emitting state on a sub-frame-by-sub-frame basis in each of the pixel circuits,
when the display mode is the low resolution mode, an image is displayed on the display by defining j pixel circuits as one group, bringing one of the j electro-optical elements into the light-emitting state in each of the pixel circuits in the frame, and bringing electro-optical elements having respective light-emitting colors different from one another into the light-emitting state in the j pixel circuits included in each group in the frame, and
the j pixel circuits are arranged continuously in the direction in which the scanning signal lines extend.

2. The display device according to claim 1, wherein when the display mode is the low resolution mode, a still image is displayed on the display at a refresh rate lower than that for when the display mode is the high resolution mode, by repeating a refresh period during which writing of image data to the pixel circuits is performed and a pause period during which the writing of image data to the pixel circuits is brought into a pause state, and
driving of the scanning signal lines and the data lines is stopped in the pause period.

3. The display device according to claim 1, wherein each of the pixel circuits further includes:
j light-emission control transistors provided in a one-to-one correspondence with the j electro-optical elements; and
drive current control circuitry configured to control a drive current to bring the j electro-optical elements into the light-emitting state, wherein the display includes j light-emission control lines for each row, in each of the pixel circuits:
control terminals of the j light-emission control transistors are connected to different light-emission control lines,
first conduction terminals of the j light-emission control transistors are connected to the drive current control circuitry, and
second conduction terminals of the j light-emission control transistors are connected to respective electro-optical elements, when focusing on the j pixel circuits included in each group and the j light-emission control lines corresponding to the j pixel circuits, each of the focused j light-emission control lines is connected to control terminals of light-emission control transistors corresponding to electro-optical elements having respective light-emitting colors different from one another in the focused j pixel circuits, when the display mode is the high resolution mode, the j light-emission control lines are sequentially brought into a selected state on a sub-frame-by-sub-frame basis for each row, and when the display mode is the low resolution mode, only one of the j light-emission control lines is brought into the selected state for each row in a frame.

4. The display device according to claim 3, wherein when focusing on the j light-emission control lines corresponding to each row, a light-emission control line brought into the selected state when the display mode is the low resolution mode is changed appropriately.

5. The display device according to claim 4, wherein a light-emission control line brought into the selected state when the display mode is the low resolution mode is changed every time the display mode is switched from the high resolution mode to the low resolution mode.

6. The display device according to claim 3, further comprising:
a first power supply line disposed in the display and configured to supply a high-level constant voltage to the pixel circuits;
a second power supply line disposed in the display and configured to supply a low-level constant voltage to the pixel circuits;
a scanning signal line drive circuit configured to drive the scanning signal lines;
a data line drive circuit configured to drive the data lines; and
a light-emission control line drive circuit configured to drive the light-emission control lines, wherein
the drive current control circuitry includes:
a drive transistor provided between the first power supply line and the second power supply line so as to be in series with each of the j light-emission control transistors, and configured to control the drive current;
an input transistor provided between a corresponding data line and a control terminal of the drive transistor, and configured to electrically connect the corresponding data line to the control terminal of the drive transistor when a corresponding scanning signal line is brought into a selected state by the scanning signal line drive circuit; and
a capacitor provided between the control terminal of the drive transistor and one conduction terminal of the drive transistor, when the display mode is the low resolution mode, a still image displayed on the display is at a refresh rate lower than that for when the display mode is the high resolution mode, by repeating a refresh period during which writing of image data to the pixel circuits is performed and a pause period during which the writing of image data to the pixel circuits is brought into a pause state, in the refresh period:
the light-emission control line drive circuit brings, for each row, only one of the j light-emission control lines into the selected state,
the scanning signal line drive circuit sequentially brings the scanning signal lines into the selected state, and
the data line drive circuit applies data voltages depending on the still image to be displayed on the display when the display mode is the low resolution mode, to the data lines, in response to each of the scanning signal lines going into the selected state, and in the pause period:
the light-emission control line drive circuit keeps the light-emission control line brought into the selected state in the refresh period in the selected state and keeps other light-emission control lines in a non-selected state, and
the scanning signal line drive circuit and the data line drive circuit go into the pause state.

7. The display device according to claim 6, wherein the light-emission control line drive circuit brings, in a period immediately before writing of image data to the pixel circuits forming each row is performed, all of the j light-emission control lines corresponding to each row into the non-selected state, in the refresh period.

8. The display device according to claim 6, wherein the drive transistor, the input transistor, and the j light-emission control transistors are thin-film transistors whose channel layers are formed of an oxide semiconductor.

9. The display device according to claim 8, wherein main components of the oxide semiconductor are indium (In), gallium (Ga), zinc (Zn), and oxygen (O).

10. The display device according to claim 1, wherein when the display mode is the low resolution mode, one pixel is formed by the j pixel circuits included in one group, and an image with a resolution equal to 1/j of a resolution of an image displayed on the display when the display mode is the high resolution mode is displayed on the display.

11. The display device according to claim 1, wherein when the display mode is the low resolution mode, one pixel is formed by k×j pixel circuits included in k groups corresponding to k consecutive rows (k is an integer greater than or equal to two), and an image with a resolution equal to 1/(k×j) of a resolution of an image displayed on the display when the display mode is the high resolution mode is displayed on the display.

12. The display device according to claim 11, wherein a value of the k is determined such that a shape of each pixel for when the display mode is the low resolution mode is a square.

13. The display device according to claim 1, wherein the j electro-optical elements included in each of the pixel circuits are three organic electroluminescence elements having a red light-emitting color, a green light-emitting color, and a blue light-emitting color.

14. The display device according to claim 1, wherein the j electro-optical elements included in each of the pixel circuits are four organic electroluminescence elements having a red light-emitting color, a green light-emitting color, a blue light-emitting color, and a white light-emitting color.

15. The display device according to claim 1 wherein when focusing on a p-th electro-optical element (p is an integer between 1 and j, inclusive) in the direction in which the scanning signal lines extend in each of the j pixel circuits included in each group, the j electro-optical elements focused in each group are electro-optical elements having respective light-emitting colors different from one another.

16. The display device according to claim 1, wherein
an alignment sequence of light-emitting colors regarding the j electro-optical elements in an arbitrary pixel circuit is different from that in a pixel circuit arranged, in the direction in which the scanning signal lines extend, next to the arbitrary pixel circuit, and
an alignment sequence of light-emitting colors regarding the j electro-optical elements in an arbitrary pixel circuit is same as that in a pixel circuit arranged, in the direction in which the scanning signal lines extend, j pixel circuits away from the arbitrary pixel circuit.

17. A driving method for a display device including a display that includes:
pixel circuits arranged in a matrix so as to define rows and columns;
scanning signal lines provided in a one-to-one correspondence with the rows; and
data lines provided in a one-to-one correspondence with the columns, each of the pixel circuits including j electro-optical elements, where j is an integer greater than or equal to two, each of the electro-optical elements having an individual different light-emitting color, the method comprising:
a high resolution display step of displaying a relatively high resolution image on the display, and
a low resolution display step of displaying a relatively low resolution image on the display, wherein
in the high resolution display step, an image is displayed on the display by dividing a frame into j sub-frames and bringing an electro-optical element having a different light-emitting color into a light-emitting state on a sub-frame-by-sub-frame basis in each of the pixel circuits, the frame being a period in which an image is displayed for one screen,
in the low resolution display step, an image is displayed on the display by defining j pixel circuits as one group, bringing one of the j electro-optical elements into the light-emitting state in each of the pixel circuits in the frame, and bringing electro-optical elements having respective light-emitting colors different from one another into the light-emitting state in the j pixel circuits included in each group in the frame, the j pixel circuits being arranged continuously in a direction in which the scanning signal lines extend,
the pixel circuits are configured such that, in the low resolution display step, intervals of the electro-optical elements which go into the light-emitting state have an equal distance between each other in the direction in which the scanning signal lines extend in each frame,
the intervals of the electro-optical elements which go into the light-emitting state in the low resolution display step have a larger distance than the intervals of the electro-optical elements which go into the light-emitting state in the high resolution display step, and
in the low resolution display step, in each of the j pixel circuits, the electro-optical element that is brought into the light-emitting state is periodically changed such that another of the electro-optical elements having a different light-emitting color is brought into the light-emitting state.

* * * * *